US010299383B2

(12) United States Patent
Hattori et al.

(10) Patent No.: US 10,299,383 B2
(45) Date of Patent: May 21, 2019

(54) COMPOSITE ELECTRONIC COMPONENT AND RESISTANCE ELEMENT

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Shinichiro Kuroiwa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 184 days.

(21) Appl. No.: 15/205,128

(22) Filed: Jul. 8, 2016

(65) Prior Publication Data
US 2017/0013718 A1 Jan. 12, 2017

(30) Foreign Application Priority Data

Jul. 10, 2015 (JP) .................................. 2015-138543

(51) Int. Cl.
*H01C 1/01* (2006.01)
*H01C 1/148* (2006.01)
(Continued)

(52) U.S. Cl.
CPC .............. *H05K 1/181* (2013.01); *H01C 1/01* (2013.01); *H01C 1/148* (2013.01); *H01G 4/232* (2013.01);
(Continued)

(58) Field of Classification Search
CPC .......... H05K 1/181; H01G 4/232; H01G 4/40; H01G 4/30; H01G 4/12; H01C 1/148; H01C 1/01
See application file for complete search history.

(56) References Cited

U.S. PATENT DOCUMENTS 4,766,412 A * 8/1988 Takakura ................. H01G 4/40
338/308
5,701,128 A * 12/1997 Okada .................... H01Q 1/243
343/700 MS
(Continued)

FOREIGN PATENT DOCUMENTS

JP      6-283301 A      10/1994
JP      07254764 A   *  10/1995
JP      2001-338838 A   12/2001

OTHER PUBLICATIONS

Hattori et al., "Composite Electronic Component and Resistor", U.S. Appl. No. 15/042,236, filed Feb. 12, 2016.
(Continued)

*Primary Examiner* — Nathan Milakovich
(74) *Attorney, Agent, or Firm* — Keating & Bennett, LLP

(57) ABSTRACT

A composite electronic component includes an electronic element and a resistance element in a height direction. The electronic element includes an electronic element body, and a first and second external electrodes separated from each other in a length direction. The resistance element includes a base portion, a resistor disposed on the upper surface of the base portion, a protective film, and first to third upper surface conductors. The first and second upper surface conductors are separated from each other in the length direction, and the resistor and the third upper surface conductor connected thereto are located between the first and the second upper surface conductors. Dimensions in the height direction from the upper surface of the base portion to the surfaces of the first and second upper surface conductors are larger than dimension in the height direction from the upper surface of the base portion to the surface of the portion overlapped with the protective film in the height direction of the third upper surface conductor.

20 Claims, 15 Drawing Sheets

(51) Int. Cl.
*H01G 4/40* (2006.01)
*H05K 1/18* (2006.01)
*H01G 4/30* (2006.01)
*H01G 4/232* (2006.01)
*H01G 4/12* (2006.01)
*H05K 1/16* (2006.01)

(52) U.S. Cl.
CPC ............... *H01G 4/30* (2013.01); *H01G 4/40* (2013.01); *H01G 4/12* (2013.01); *H05K 1/167* (2013.01); *H05K 2201/049* (2013.01); *H05K 2201/10015* (2013.01); *H05K 2201/10022* (2013.01); *H05K 2201/10515* (2013.01); *Y02P 70/611* (2015.11)

(56) References Cited

U.S. PATENT DOCUMENTS

| | | | | |
|---|---|---|---|---|
| 8,264,816 B2* | 9/2012 | Bultitude | ............... | H01G 2/16 361/321.4 |
| 9,288,908 B2* | 3/2016 | Yamamoto | ............... | H01G 4/40 |
| 9,450,556 B2* | 9/2016 | Korony | ............... | H01C 1/148 |
| 9,832,877 B2* | 11/2017 | Hattori | ............... | H05K 1/181 |
| 10,134,529 B2* | 11/2018 | Hattori | ............... | H01G 4/40 |
| 2010/0225439 A1* | 9/2010 | Han | ............... | H01C 1/012 338/309 |
| 2015/0340154 A1* | 11/2015 | Kim | ............... | H01G 2/14 174/260 |
| 2016/0268050 A1* | 9/2016 | Hattori | ............... | H01G 4/40 |
| 2016/0372265 A1* | 12/2016 | Hattori | ............... | H01G 4/30 |
| 2017/0011857 A1* | 1/2017 | Hattori | ............... | H01G 4/40 |
| 2017/0013718 A1* | 1/2017 | Hattori | ............... | H01G 4/40 |
| 2017/0278638 A1* | 9/2017 | Hattori | ............... | H01G 2/06 |
| 2018/0075974 A1* | 3/2018 | Hattori | ............... | H01G 4/40 |
| 2018/0075975 A1* | 3/2018 | Hattori | ............... | H01G 4/40 |

OTHER PUBLICATIONS

Hattori et al., "Composite Electronic Component", U.S. Appl. No. 15/176,564, filed Jun. 8, 2016.
Hattori et al., "Composite Electronic Component and Resistance Element", U.S. Appl. No. 15/205,120, filed Jul. 8, 2016.
Hattori et al., "Composite Electronic Component and Resistance Element", U.S. Appl. No. 15/205,124, filed Jul. 8, 2016.

* cited by examiner

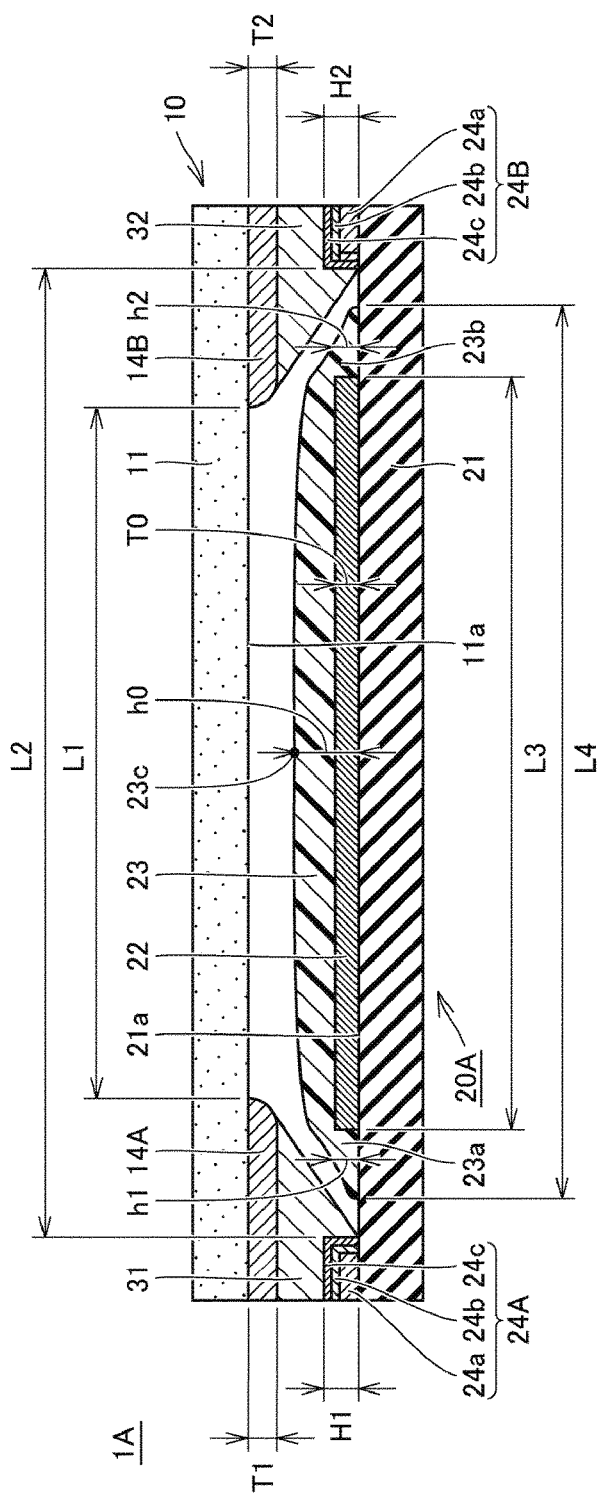
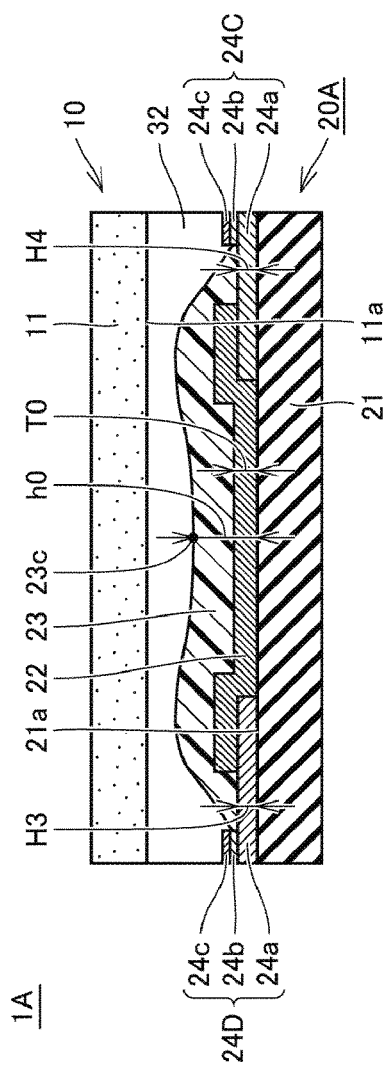
FIG. 6A
FIG. 6B

COMPOSITE ELECTRONIC COMPONENT AND RESISTANCE ELEMENT

CROSS REFERENCE TO RELATED APPLICATIONS

This application claims the benefit of priority to Japanese Patent Application 2015-138543 filed on Jul. 10, 2015, the entire contents of which are hereby incorporated herein by reference.

BACKGROUND OF THE INVENTION

1. Field of the Invention

The present invention relates to a composite electronic component including a resistance element and another electronic element, and a resistance element for use in the composite electronic component.

2. Description of the Related Art

Conventionally, there have been proposed inventions of composite electronic components including a plurality of electronic elements from the view point of integrating the electronic components with high density.

For example, JP-A 2001-338838 discloses a composite electronic component including a capacitor element and a resistance element. In this composite electronic component, a resistance element consisting exclusively of a resistor is disposed on the surface of a capacitor body of a chip capacitor. On the surface of the capacitor body, a pair of external electrodes is provided, and the external electrodes are connected with the resistor.

JP-A 6-283301 discloses a composite electronic component in which among two or more kinds of electronic elements selected from a plurality of kinds of electronic elements including a chip resistance, a chip thermistor, a chip capacitor and a chip varistor, electronic elements of the same shape and the same dimension are integrated. In this composite electronic component, these electronic elements are overlapped along the thickness direction, and respective terminal electrodes provided in these electronic elements are collectively covered with a lead frame to integrate the same.

The present inventors proposed in Japanese Patent Application No. 2015-049457 (U.S. patent application Ser. No. 15/042,236) a composite electronic component capable of improving the degree of freedom in circuit design compared with those disclosed in JP-A 2001-338838 and JP-A 6-283301. The composite electronic component is a novel composite electronic component including one substrate-type electronic element in which an insulating base portion functioning as a substrate is provided with a resistance function, and another electronic element joined with the substrate-type electronic element.

In the novel composite electronic component, the upper surface of the insulating base portion of the substrate-type electronic element faces another electronic element. On this upper surface, an upper surface conductor is disposed, and the upper surface conductor and an external electrode of another electronic element are connected via a joint material. In one preferred embodiment of the composite electronic component including a novel structure, a functional portion in addition to the upper surface conductor is provided on the upper surface of the insulating base portion of the substrate-type electronic element. The functional portion includes a resistor, other upper surface conductor connected with the resistor, and a protective film to protect the resistor.

When the substrate-type electronic element includes the functional portion on the upper surface, the functional portion can possibly come into contact with the other electronic element in mounting the other electronic element on the substrate-type electronic element. As the functional portion comes into contact with the other electronic element, the external electrode of the other electronic element becomes more distant from the upper surface conductor of the substrate-type electronic element, and as a result, insufficient joining between the substrate-type electronic element and the other electronic element, a so-called defective joining can occur.

SUMMARY OF THE INVENTION

Therefore, preferred embodiments of the present invention provide a composite electronic component that significantly reduces or prevents defective joining between electronic elements during production, and a resistance element for use in the same.

A composite electronic component according to a preferred embodiment of the present invention includes a resistance element, and an electronic element mounted on the resistance element in a height direction. The resistance element includes an insulating base portion including an upper surface and a lower surface intersecting with the height direction, a first upper surface conductor and a second upper surface conductor that are disposed on the upper surface of the base portion and separated from each other in a length direction perpendicular or substantially perpendicular to the height direction, a resistor that is disposed on the upper surface of the base portion and located between the first upper surface conductor and the second upper surface conductor, a third upper surface conductor disposed on the upper surface of the base portion, that is located between the first upper surface conductor and the second upper surface conductor and connected with the resistor, and a protective film that covers the resistor, a portion of the base portion, and at least a portion of the third upper surface conductor. The electronic element includes an electronic element body including a lower surface intersecting the height direction, and a first external electrode and a second external electrode that are disposed at least on the lower surface of the electronic element body and separated from each other in the length direction. The upper surface of the base portion and the lower surface of the electronic element body face each other in the height direction. The first upper surface conductor and the first external electrode are electrically connected, and the second upper surface conductor and the second external electrode are electrically connected. Both the dimension in the height direction from the upper surface of the base portion to the surface of the first upper surface conductor, and the dimension in the height direction from the upper surface of the base portion to the surface of the second upper surface conductor are larger than the dimension in the height direction from the upper surface of the base portion to the surface of a portion of the third upper surface conductor overlapped with the protective film in the height direction of the third upper surface conductor.

In a composite electronic component according to a preferred embodiment of the present invention, each of the first upper surface conductor and the second upper surface conductor may include a plating layer, and in that case, a portion overlapped with the protective film in the height direction of the third upper surface conductor is preferably a sintered metal layer or a thin film directly covered with the protective film.

In a composite electronic component according to a preferred embodiment of the present invention, each of the first upper surface conductor, the second upper surface conductor and the third upper surface conductor may include a sintered metal layer, and in that case, it is preferred that the dimension in the height direction of the sintered metal layer included in each of the first upper surface conductor and the second upper surface conductor is larger than the dimension in the height direction of a portion overlapped with the protective film in the height direction of the sintered metal layer included in the third upper surface conductor.

In a composite electronic component according to a preferred embodiment of the present invention, each of the first upper surface conductor and the second upper surface conductor may include a sintered metal layer, and in that case, a portion overlapped with the protective film in the height direction of the third upper surface conductor is preferably a sputtered film.

In a composite electronic component according to a preferred embodiment of the present invention, the resistance element may further include a first lower surface conductor and a second lower surface conductor that are disposed on the lower surface of the base portion and separated from each other in the length direction, a third lower surface conductor that is disposed on the lower surface of the base portion and located between the first lower surface conductor and the second lower surface conductor, a first connecting conductor connecting the first upper surface conductor and the first lower surface conductor, a second connecting conductor connecting the second upper surface conductor and the second lower surface conductor, and a third connecting conductor connecting the third upper surface conductor and the third lower surface conductor.

In a composite electronic component according to a preferred embodiment of the present invention, the resistance element may further include a fourth upper surface conductor disposed on the upper surface of the base portion, that is located between the first upper surface conductor and the second upper surface conductor and connected with the resistor, and in that case, the third upper surface conductor and the fourth upper surface conductor may be separated from each other. Also, the protective film may cover at least a portion of the fourth upper surface conductor. Also in that case, both the dimension in the height direction from the upper surface of the base portion to the surface of the first upper surface conductor, and the dimension in the height direction from the upper surface of the base portion to the surface of the second upper surface conductor may be larger than the dimension in the height direction from the upper surface of the base portion to the surface of a portion overlapped with the protective film in the height direction of the fourth upper surface conductor.

In a composite electronic component according to a preferred embodiment of the present invention, each of the first upper surface conductor and the second upper surface conductor may include a plating layer, and in that case, it is preferred that each of the portion overlapped with the protective film in the height direction of the third upper surface conductor, and the portion overlapped with the protective film in the height direction of the fourth upper surface conductor is a sintered metal layer or a thin film directly covered with the protective film.

In a composite electronic component according to a preferred embodiment of the present invention, each of the first upper surface conductor, the second upper surface conductor, the third upper surface conductor and the fourth upper surface conductor may include a sintered metal layer, and in that case, it is preferred that the dimension in the height direction of the sintered metal layer included in each of the first upper surface conductor and the second upper surface conductor is larger than both the dimension in the height direction of the portion overlapped with the protective film in the height direction of the sintered metal layer included in the third upper surface conductor, and the dimension in the height direction of the portion overlapped with the protective film in the height direction of the sintered metal layer included in the fourth upper surface conductor.

In a composite electronic component according to a preferred embodiment of the present invention, each of the first upper surface conductor and the second upper surface conductor may include a sintered metal layer, and in that case, it is preferred that each of the portion overlapped with the protective film in the height direction of the third upper surface conductor, and the portion overlapped with the protective film in the height direction of the fourth upper surface conductor is a sputtered film.

In a composite electronic component according to a preferred embodiment of the present invention, the resistance element may further include a first lower surface conductor and a second lower surface conductor that are disposed on the lower surface of the base portion and separated from each other in the length direction, a third lower surface conductor and a fourth lower surface conductor that are disposed on the lower surface of the base portion, that are separated from each other and located between the first lower surface conductor and the second lower surface conductor, a first connecting conductor connecting the first upper surface conductor and the first lower surface conductor, a second connecting conductor connecting the second upper surface conductor and the second lower surface conductor, a third connecting conductor connecting the third upper surface conductor and the third lower surface conductor, and a fourth connecting conductor connecting the fourth upper surface conductor and the fourth lower surface conductor.

A resistance element according to a preferred embodiment of the present invention includes an insulating base portion including an upper surface and a lower surface intersecting with the height direction, a first upper surface conductor and a second upper surface conductor that are disposed on the upper surface of the base portion and separated from each other in a length direction perpendicular or substantially perpendicular to the height direction, a resistor that is disposed on the upper surface of the base portion and located between the first upper surface conductor and the second upper surface conductor, a third upper surface conductor disposed on the upper surface of the base portion, that is located between the first upper surface conductor and the second upper surface conductor and connected with the resistor, and a protective film that covers the resistor, a portion of the base portion, and at least a portion of the third upper surface conductor. Both the dimension in the height direction from the upper surface of the base portion to the surface of the first upper surface conductor, and the dimension in the height direction from the upper surface of the base portion to the surface of the second upper surface conductor are larger than the dimension in the height direction from the upper surface of the base portion to the surface of a portion overlapped with the protective film in the height direction of the third upper surface conductor.

In a resistance element according to a preferred embodiment of the present invention, each of the first upper surface conductor and the second upper surface conductor may include a plating layer, and in that case, a portion overlapped with the protective film in the height direction of the third upper surface conductor is preferably a sintered metal layer or a thin film directly covered with the protective film.

In a resistance element according to a preferred embodiment of the present invention, each of the first upper surface conductor, the second upper surface conductor and the third upper surface conductor may include a sintered metal layer, and in that case, it is preferred that the dimension in the height direction of the sintered metal layer included in each of the first upper surface conductor and the second upper surface conductor is larger than the dimension in the height direction of a portion overlapped with the protective film in the height direction of the sintered metal layer included in the third upper surface conductor.

In a resistance element according to a preferred embodiment of the present invention, each of the first upper surface conductor and the second upper surface conductor may include a sintered metal layer, and in that case, a portion overlapped with the protective film in the height direction of the third upper surface conductor is preferably a sputtered film.

A resistance element according to a preferred embodiment of the present invention may further include a first lower surface conductor and a second lower surface conductor that are disposed on the lower surface of the base portion and separated from each other in the length direction, a third lower surface conductor that is disposed on the lower surface of the base portion and located between the first lower surface conductor and the second lower surface conductor, a first connecting conductor connecting the first upper surface conductor and the first lower surface conductor, a second connecting conductor connecting the second upper surface conductor and the second lower surface conductor, and a third connecting conductor connecting the third upper surface conductor and the third lower surface conductor.

A resistance element according to a preferred embodiment of the present invention may further include a fourth upper surface conductor disposed on the upper surface of the base portion, that is located between the first upper surface conductor and the second upper surface conductor and connected with the resistor, and in that case, the third upper surface conductor and the fourth upper surface conductor may be separated from each other. Also, the protective film may cover at least a portion of the fourth upper surface conductor. Also in that case, both the dimension in the height direction from the upper surface of the base portion to the surface of the first upper surface conductor, and the dimension in the height direction from the upper surface of the base portion to the surface of the second upper surface conductor may be larger than the dimension in the height direction from the upper surface of the base portion to the surface of a portion overlapped with the protective film in the height direction of the fourth upper surface conductor.

In a resistance element according to a preferred embodiment of the present invention, each of the first upper surface conductor and the second upper surface conductor may include a plating layer, and in that case, it is preferred that each of the portion overlapped with the protective film in the height direction of the third upper surface conductor, and the portion overlapped with the protective film in the height direction of the fourth upper surface conductor is a sintered metal layer or a thin film directly covered with the protective film.

In a resistance element according to a preferred embodiment of the present invention, each of the first upper surface conductor, the second upper surface conductor, the third upper surface conductor and the fourth upper surface conductor may include a sintered metal layer, and in that case, it is preferred that the dimension in the height direction of the sintered metal layer included in each of the first upper surface conductor and the second upper surface conductor is larger than both the dimension in the height direction of the portion overlapped with the protective film in the height direction of the sintered metal layer included in the third upper surface conductor, and the dimension in the height direction of the portion overlapped with the protective film in the height direction of the sintered metal layer included in the fourth upper surface conductor.

In a resistance element according to a preferred embodiment of the present invention, each of the first upper surface conductor and the second upper surface conductor may include a sintered metal layer, and in that case, it is preferred that each of the portion overlapped with the protective film in the height direction of the third upper surface conductor, and the portion overlapped with the protective film in the height direction of the fourth upper surface conductor is a sputtered film.

A resistance element according to a preferred embodiment of the present invention may further include a first lower surface conductor and a second lower surface conductor that are disposed on the lower surface of the base portion and separated from each other in the length direction, a third lower surface conductor and a fourth lower surface conductor that are disposed on the lower surface of the base portion, are separated from each other and are located between the first lower surface conductor and the second lower surface conductor, a first connecting conductor connecting the first upper surface conductor and the first lower surface conductor, a second connecting conductor connecting the second upper surface conductor and the second lower surface conductor, a third connecting conductor connecting the third upper surface conductor and the third lower surface conductor, and a fourth connecting conductor connecting the fourth upper surface conductor and the fourth lower surface conductor.

According to various preferred embodiments of the present invention, it is possible to provide a composite electronic component that significantly reduces or prevents defective joining between electronic elements during production, and a resistance element for use therein.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A and 6B is an enlarged schematic section view of the portion of the composite electronic component shown in FIG. 1.

DETAILED DESCRIPTION OF THE PREFERRED EMBODIMENTS

Hereinafter, preferred embodiments of the present invention will be specifically described by referring to attached drawings. It is noted that in the following preferred embodiments, the same or a common element is denoted by the same reference sign in different drawings and the description thereof will not be repeated in principle.

Here, as part of this description, the content of Japanese Patent Application No. 2015-049457 is incorporated by reference.
Preferred Embodiment 1

Figure 1:
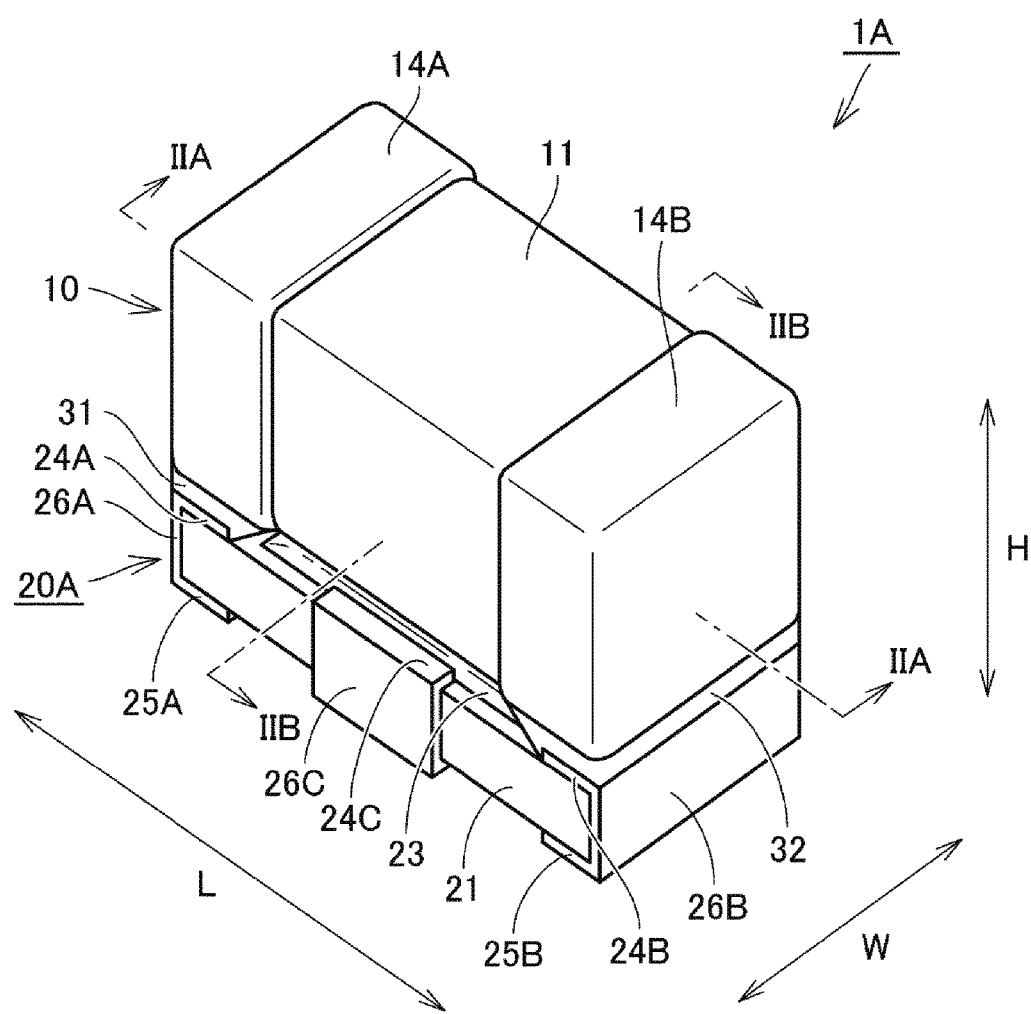
FIG. 1 is a schematic perspective view of a composite electronic component according to Preferred Embodiment 1 of the present invention.
Figure 2A:
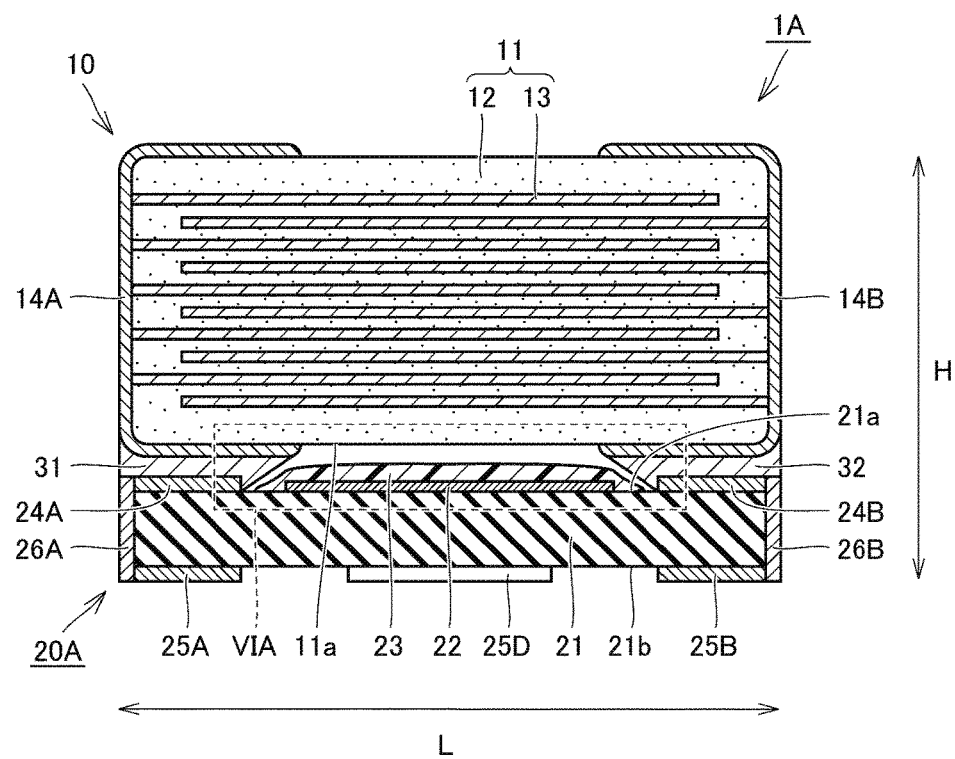
FIGS. 2A and 2B are schematic section views of the composite electronic component shown in FIG. 1.
Figure 2B:
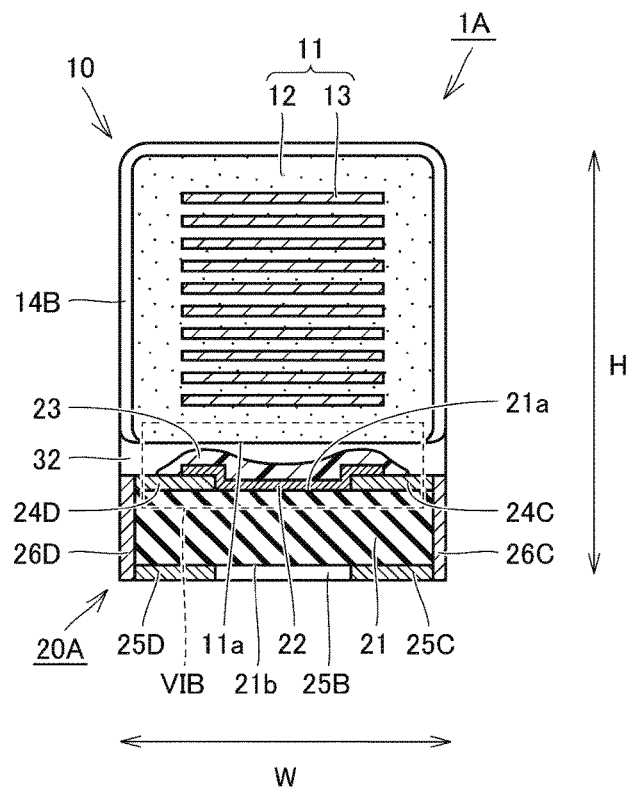
Figure 3A:
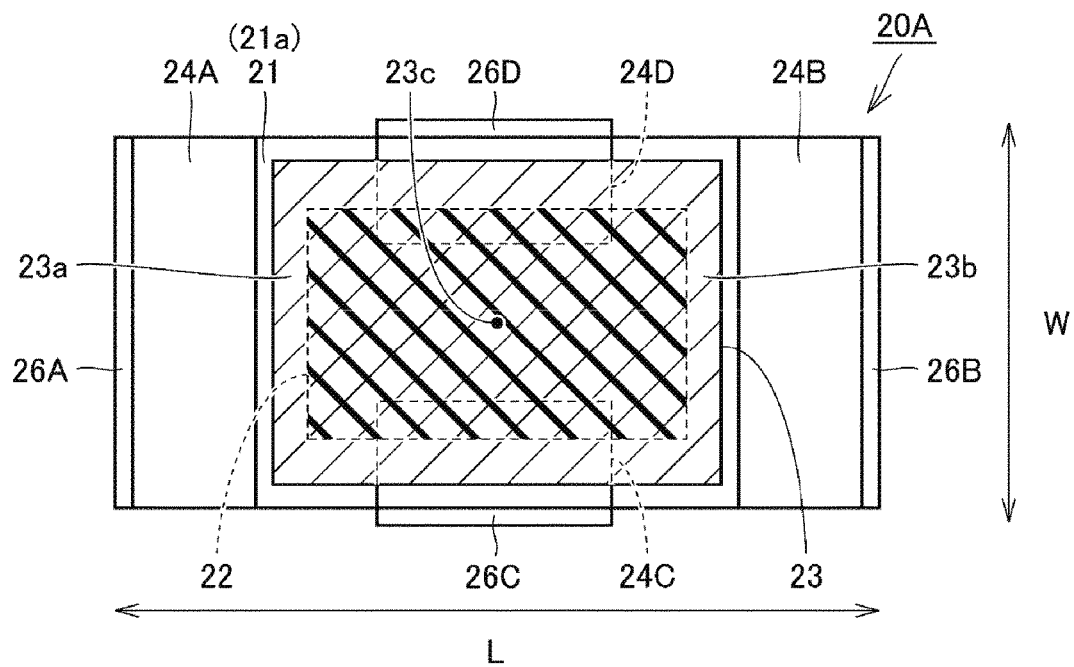
FIGS. 3A and 3B are a schematic top view and a schematic bottom view of the resistance element shown in FIG. 1.
Figure 3B:
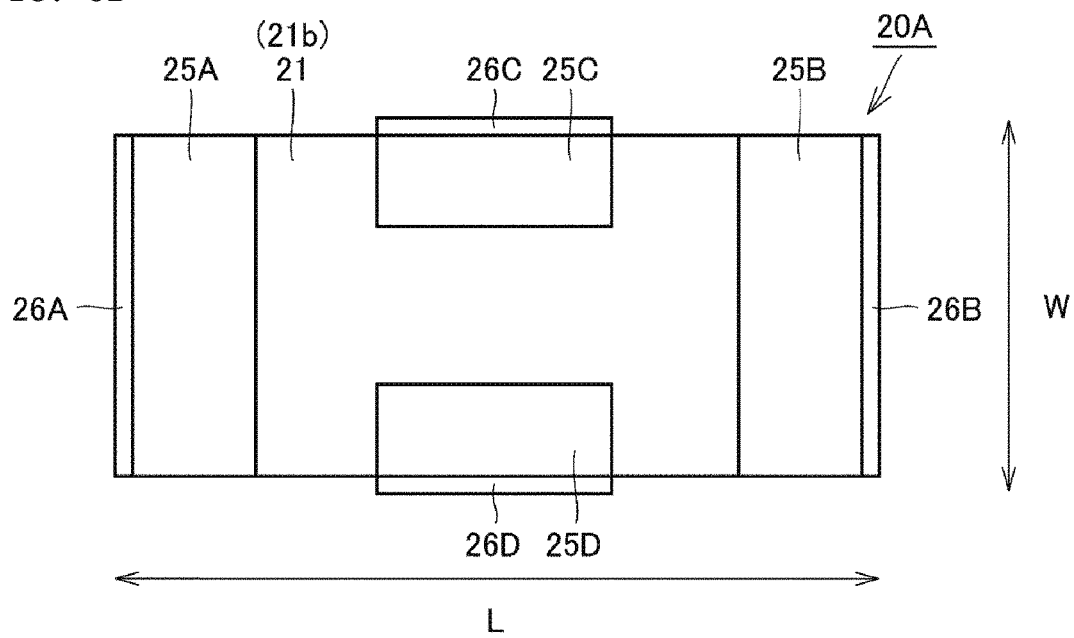
Figure 4:
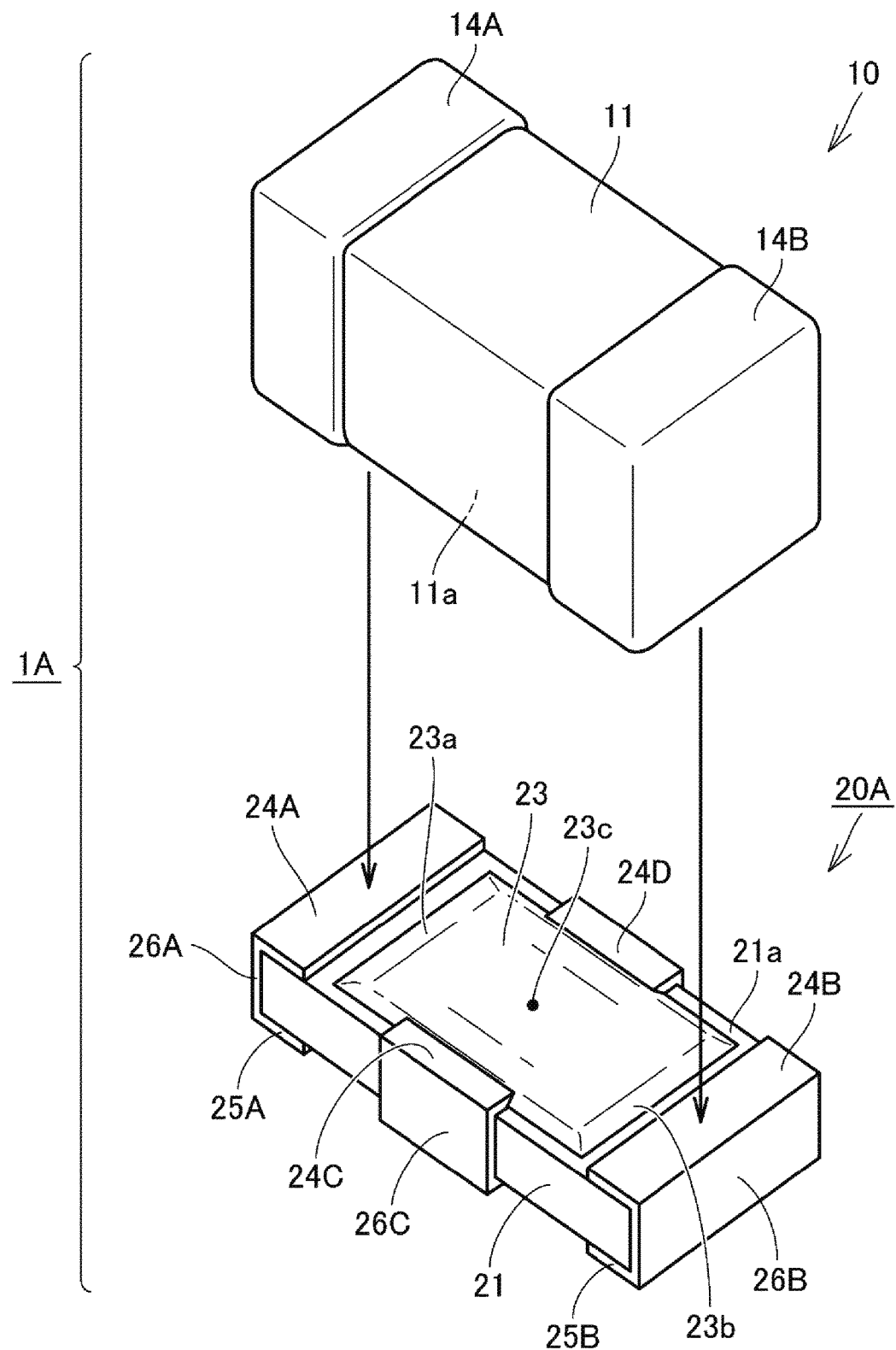
FIG. 4 is an exploded schematic perspective view of the composite electronic component shown in FIG. 1.

FIG. 1 is a schematic perspective view of a composite electronic component 1A according to Preferred Embodiment 1 of the present invention. FIG. 2A and FIG. 2B are schematic section views of the composite electronic component 1A according to the present preferred embodiment cut along the line IIA-IIA and the line IIB-IIB shown in FIG. 1, respectively. FIG. 3A and FIG. 3B are a schematic top view and a schematic bottom view of a resistance element 20A shown in FIG. 1, respectively. FIG. 4 is an exploded schematic perspective view of the composite electronic component 1A according to the present preferred embodiment shown in FIG. 1. Referring to FIG. 1 to FIG. 4, structures of the composite electronic component 1A and the resistance element 20A according to the present preferred embodiment will be described.

As illustrated in FIG. 1, FIG. 2A, FIG. 2B and FIG. 4, the composite electronic component 1A according to the present preferred embodiment includes two electronic components. Specifically, the composite electronic component 1A includes a capacitor element 10 as a first electronic element and a resistance element 20A as a second electronic element. The capacitor element is an electronic component including a capacitor element (C). The resistance element 20A is an electronic component including a resistor element (R).

As illustrated mainly in FIG. 1 and FIG. 4, the capacitor element 10 has a substantially rectangular parallelepiped shape, and the dimension of the four sides along a length direction L is larger than the dimension of the four sides along a width direction W. The substantially rectangular parallelepiped shape used herein includes those in which corner portions and ridge portions of the rectangular parallelepiped are rounded, and those in which a step or unevenness is provided on a portion or an entirety of the six surfaces of the rectangular parallelepiped.

Similarly as illustrated mainly in FIG. 1 and FIG. 4, the resistance element 20A has a substantially plate shape including a predetermined thickness, and the dimension of four sides along the length direction L is larger than the dimension of four sides along the width direction W. The substantially plate shape used herein includes those in which corner portions and ridge portions of the resistance element 20A are rounded, and those in which a step or unevenness is provided on a portion or an entirety of the six surfaces of the resistance element 20A.

As illustrated in FIG. 1, FIG. 2A, FIG. 2B and FIG. 4, the capacitor element 10 is arranged on the resistance element 20A. In this arrangement, a lower surface 11a of the capacitor element 10, and an upper surface 21a of the resistance element 20A face each other. As illustrated in FIG. 1, FIG. 2A and FIG. 2B, the capacitor element 10 is joined with the resistance element 20A via a first joint material 31 and a second joint material 32.

In description of preferred embodiments of the present invention, for specifically describing the structure of the composite electronic component 1A, the direction in which the capacitor element 10 and the resistance element 20A align is called a height direction H. Of the directions perpendicular or substantially perpendicular to the height direction H, the direction in which a first and a second external electrodes 14A, 14B of the later-described capacitor element 10 align is called a length direction L. The direction perpendicular or substantially perpendicular to both of the height direction H and the length direction L is called a width direction W. The first external electrode 14A and the second external electrode 14B will be described later in detail.

As illustrated in FIG. 1, FIG. 2A, FIG. 2B and FIG. 4, the capacitor element 10 is, for example, a multilayer ceramic capacitor, and includes a capacitor body 11, and a first external electrode 14A and a second external electrode 14B disposed on the surface of the capacitor body 11. The capacitor body 11 has a substantially rectangular parallelepiped shape, and the first external electrode 14A and the second external electrode 14B disposed in a predetermined region on its surface are separated from each other in the length direction L.

As illustrated in FIG. 2A and FIG. 2B, the capacitor body 11 includes a plurality of dielectric layers 12 and a plurality of internal electrode layers 13, and each one of the dielectric layers 12 and each one of the internal electrode layers 13 are laminated alternately to constitute the capacitor body 11. In the composite electronic component 1A according to the present preferred embodiment, the direction of laminating the plurality of dielectric layers 12 and the plurality of internal electrode layers 13 almost coincides with the height direction H. However, this is merely illustrative, and the direction of laminating the plurality of dielectric layers 12 and the plurality of internal electrode layers 13 may coincide with the width direction W.

The plurality of dielectric layers 12 are formed of a material including a ceramic material including, for example, barium titanate ($BaTiO_3$), calcium titanate ($CaTiO_3$), strontium titanate ($SrTiO_3$), potassium zirconate ($CaZrO_3$) or the like as a main component. The plurality of dielectric layers 12 may include Mn, Mg, Si, Co, Ni, rare earth metal or the like as a secondary component which is smaller in quantity than the main component. Meanwhile, the plurality of internal electrode layers 13 are formed of a material including a metal material such as Ni, Cu, Ag, Pd, Ag—Pd alloy, or Au.

Each of the first external electrode 14A and the second external electrode 14B includes a plurality of conductive layers including an underlying conductive layer and a covering conductive layer. The underlying conductive layer is a conductive layer provided directly in a portion of the surface of capacitor body 11, and the covering conductive layer is a conductive layer that covers the underlying electrode layer. The underlying conductive layer is, for example, a sintered metal layer, and the sintered metal layer is the layer that is formed by baking a paste including Cu, Ni, Ag, Pd, Ag—Pd alloy, or Au, and glass. The underlying conductive layer of the present preferred embodiment is a Cu layer baked with a paste including Cu. The covering conductive layer is, for example, a plating layer, and the plating layer is a layer formed by a plating treatment. The covering conductive layer of the present preferred embodiment includes a plating layer including Ni and a plating layer including Sn. The covering conductive layer may be a plating layer including Cu or a plating layer including Au in place of Ni layer and Sn layer.

The first external electrode 14A and the second external electrode 14B may be defined exclusively by the plating layer while the underlying conductive layer is omitted. The underlying conductive layer may formed of a conductive resin layer obtained by curing a conductive resin paste including a metal component and a resin component.

As illustrated in FIG. 1, FIG. 2A and FIG. 2B, the capacitor body 11 includes a pair of end surfaces that is opposite to each other in the length direction L, a pair of lateral surfaces that is opposite to each other in the width direction W, and a pair of principal surfaces that is opposite to each other in the height direction H. Among these, the lower surface 11a which is one of the pair of principal surfaces that is opposite to each other in the height direction H faces the resistance element 20A.

The first external electrode 14A is provided continuously with the one end surface of the capacitor body 11, and a portion of each of the pair of lateral surfaces and the pair of principal surface, and the second external electrode 14B is provided continuously with the other end surface of the capacitor body 11 and a portion of each of the pair of lateral surfaces and the pair of principal surfaces. As a result, the lower surface 11a of the capacitor body 11 can be divided into the region where the first external electrode 14A is provided, the region where the second external electrode 14B is provided, and the region where these are not provided and a portion of the capacitor body 11 is exposed.

As illustrated in FIG. 2A and FIG. 2B, one of the two layers of the plurality of internal electrode layers 13 neighboring with one layer of the plurality of dielectric layers 12 interposed therebetween along the height direction H is a first internal electrode layer that is drawn out to one end surface of the capacitor body 11 and is connected with the first external electrode 14A. And the other is a second internal electrode layer that is drawn out to the other end surface of the capacitor body 11 and is connected with the second external electrode 14B. As a result, the first external electrode 14A and the second external electrode 14B provide a structure in which a plurality of capacitors are electrically connected in parallel.

The capacitor element 10 is produced, for example, in the following manner. A ceramic green sheet which is to be the dielectric layer 12, and a material sheet on which a conductive paste which is to be the internal electrode layer 13 is printed are laminated alternately in such a manner that the latter is stacked on the surface of the former, and then they are pressure bonded to obtain a multilayer chip. Here, it is also possible to manufacture a multilayer block in which a plurality of multilayer chips are integrated first, and then detach the multilayer block to manufacture multilayer chips. Then the multilayer chip is fired to obtain the capacitor body 11. Thereafter, on the surface of the capacitor body 11, the first external electrode 14A and the second external electrode 14B are formed, and thus the capacitor element 10 is produced.

The size of the capacitor element 10 is not particularly limited, and as one example, the dimension thereof in the length direction L is about 0.60 mm, the dimension thereof in the width direction W is about 0.30 mm, and the dimension thereof in the height direction H is about 0.30 mm.

As illustrated in FIG. 1 to FIG. 4, the resistance element 20A according to the present preferred embodiment includes an insulating base portion 21, a resistor 22, a protective film 23, a first upper surface conductor 24A, a second upper surface conductor 24B, a third upper surface conductor 24C, and a fourth upper surface conductor 24D (hereinafter, also written as "first upper surface conductor 24A to fourth upper surface conductor 24D" collectively), a first lower surface conductor 25A, a second lower surface conductor 25B, a third lower surface conductor 25C, and a fourth lower surface conductor 25D (hereinafter, also written as "first lower surface conductor 25A to fourth lower surface conductor 25D" collectively), a first connecting conductor 26A, a second connecting conductor 26B, a third connecting conductor 26C, and a fourth connecting conductor 26D (hereinafter, also written as "first connecting conductor 26A to fourth connecting conductor 26D" collectively). When the first connecting conductor 26A to the fourth connecting conductor 26D are disposed on the later-described first lateral surface to the fourth lateral surface of the base portion 21, respectively, these are also called the first lateral surface conductor 26A to the fourth lateral surface conductor 26D as appropriate.

As illustrated mainly in FIG. 1 and FIG. 4, the base portion 21 has a substantially plate-shaped structure including a predetermined thickness, and is formed, for example, of a resin material such as epoxy resin, a ceramic material such as alumina, or materials in which a filler or woven fabric formed of an inorganic material or an organic material is added to the resin material or the ceramic material. More preferably, an alumina substrate, or a ceramic substrate including a low temperature co-fired ceramic (LTCC) substrate is used as the base portion 21. In the present preferred embodiment, an alumina substrate is used as the base portion 21.

The base portion 21 includes a first lateral surface and a second lateral surface which are a pair of lateral surfaces opposite to each other in the length direction L, a third lateral surface and a fourth lateral surface which are a pair of lateral surfaces opposite to each other in the width direction W, and a pair of principal surfaces opposite to each other in the height direction H. As illustrated in FIG. 2A, FIG. 2B and FIG. 4, the upper surface 21a which is one of the pair of principal surfaces faces the lower surface 11a of the capacitor element 10, and a lower surface 21b which is the other of the pair of principal surfaces faces the wiring substrate (not illustrated) on which the composite electronic component 1A is mounted.

As illustrated in FIG. 2A, FIG. 2B, FIG. 3A and FIG. 3B, the resistor 22 is disposed at a predetermined position on the upper surface 21a of the base portion 21, and has a rectangular or circular film shape when the resistance element 20A is planarly viewed along the height direction H. As the resistor 22, diverse materials can be used depending on the use, and for example, a metal film, a metal oxide film, a metal glaze film which is a mixture of a metal oxide film and glass, and the like can be used. From the view point of temperature characteristics and so on, it is preferred that the resistor 22 is formed of a metal material. In the present preferred embodiment, the resistor 22 includes a thick film that is formed by a so-called thick film forming process in which a paste is applied, and the applied paste is baked, and the thickness thereof is, for example, about 5 μm to about 30 μm inclusive.

The protective film 23 covers the resistor 22 on the upper surface 21a of the base portion 21, and includes an insulating film of, for example, inorganic materials such as glass or $SiO_2$, resin materials such as epoxy resin or polyimide resin, or composite films of these. The thickness of the protective film 23 is, for example, about 5 μm to about 30 μm inclusive, and in the present preferred embodiment, the protective film 23 is a composite film including a film of an inorganic material including a thickness of about 2 μm, and a film of a resin material including a thickness of about 10 μm provided thereon, for example. Here, it is preferred that the protective film 23 completely covers the resistor 22 so that the resistor 22 will not be exposed.

As illustrated mainly in FIG. 2A and FIG. 4, the first upper surface conductor 24A and the second upper surface conductor 24B are disposed on the upper surface 21a of the base portion 21. The first upper surface conductor 24A and the second upper surface conductor 24B include a plurality of conductive layers including a substantially rectangular shape when the resistance element 20A is viewed planarly along the height direction H. The first upper surface conductor 24A is disposed between the center and the first lateral surface of the base portion 21 in the length direction L, and the second upper surface conductor 24B is disposed between the center and the second lateral surface of the base portion 21 in the length direction L. The first upper surface conductor 24A and the second upper surface conductor 24B are separated from each other in the length direction L, for example, by a distance of about 0.35 mm, for example.

Figure 9A:
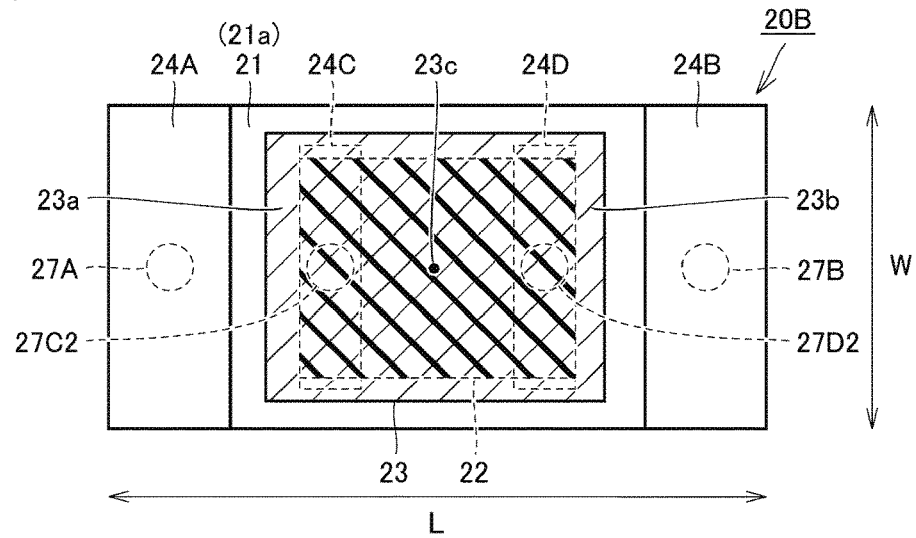
FIGS. 9A-9C are a schematic top view, a schematic section view and a schematic bottom view of the resistance element shown in FIG. 8A and FIG. 8B.
Figure 9B:
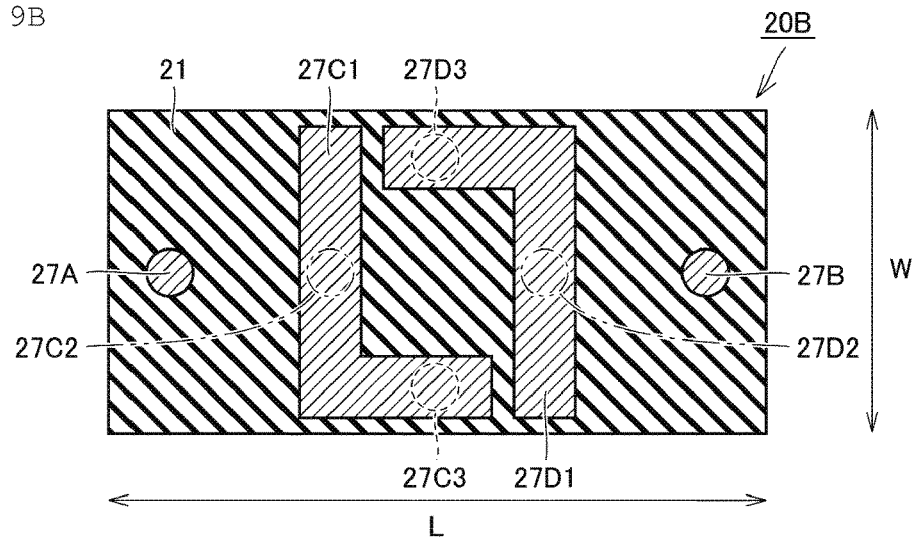
Figure 9C:
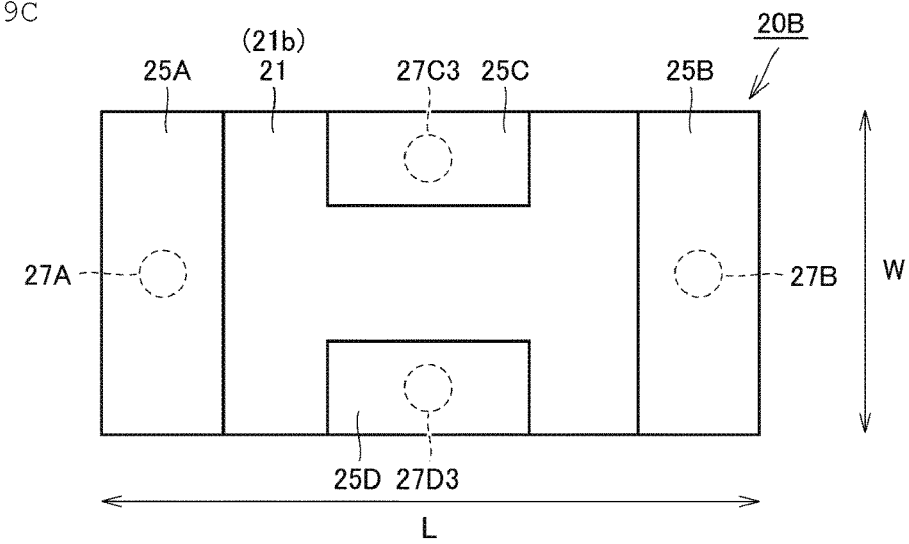

As illustrated mainly in FIG. 2B and FIG. 4, the third upper surface conductor 24C and the fourth upper surface conductor 24D are disposed on the upper surface 21a of the base portion 21. The third upper surface conductor 24C and the fourth upper surface conductor 24D include a conductive layer or a plurality of conductive layers including a substantially rectangular shape when the resistance element 20A is viewed planarly along the height direction H. The third upper surface conductor 24C and the fourth upper surface conductor 24D are disposed between the first upper surface conductor 24A and the second upper surface conductor 24B in the length direction L. The first upper surface conductor 24A and the second upper surface conductor 24B are shorter than the first upper surface conductor 24A and the second upper surface conductor 24B in the width direction W. The third upper surface conductor 24C is disposed between the center and the third lateral surface of the base portion 21 in the width direction W, and the fourth upper surface conductor 24D is disposed between the center and the fourth lateral surface of the base portion 21 in the width direction W. The third upper surface conductor 24C and the fourth upper surface conductor 24D are separated from each other in the width direction W, for example, by a distance of about 0.12 mm. The arrangement of the third upper surface conductor 24C and the fourth upper surface conductor 24D is not limited to this, and for example, the arrangement as shown in FIGS. 9A-9C can be applicable. The arrangement shown in FIGS. 9A-9C will be described in detail in another preferred embodiment.

As illustrated mainly in FIG. 2A, the first lower surface conductor 25A and the second lower surface conductor 25B are disposed on the lower surface 21b of the base portion 21. The first lower surface conductor 25A and the second lower surface conductor 25B include a plurality of conductive layers including a substantially rectangular shape when the resistance element 20A is viewed planarly along the height direction H. The first lower surface conductor 25A is disposed between the center and the first lateral surface of the base portion 21 in the length direction L, and the second lower surface conductor 25B is disposed between the center and the second lateral surface of the base portion 21 in the length direction L. The first lower surface conductor 25A and the second lower surface conductor 25B are separated from each other in the length direction L. The first lower surface conductor 25A is opposite to the first upper surface conductor 24A with the base portion 21 interposed therebetween, and the second lower surface conductor 25B is opposite to the second upper surface conductor 24B with the base portion 21 interposed therebetween.

As illustrated mainly in FIG. 2B, the third lower surface conductor 25C and the fourth lower surface conductor 25D are disposed on the lower surface 21b of the base portion 21. The third lower surface conductor 25C and the fourth lower surface conductor 25D include a plurality of conductive layers including a substantially rectangular shape when the resistance element 20A is viewed planarly along the height direction H. The third lower surface conductor 25C and the fourth lower surface conductor 25D are disposed between the first lower surface conductor 25A and the second lower surface conductor 25B in the length direction L. The third lower surface conductor 25C is disposed between the center and the third lateral surface of the base portion 21 in the width direction W, and the fourth lower surface conductor 25D is disposed between the center and the fourth lateral surface of the base portion 21 in the width direction W. The third lower surface conductor 25C and the fourth lower surface conductor 25D are separated from each other in the width direction W. The third lower surface conductor 25C is opposite to the third upper surface conductor 24C with the base portion 21 interposed therebetween, and the fourth lower surface conductor 25D is opposite to the fourth upper surface conductor 24D with the base portion 21 interposed therebetween. The arrangement of the third lower surface conductor 25C and the fourth lower surface conductor 25D is not limited to this, and for example, the arrangement as shown in FIGS. 9A-9C can be applicable. The arrangement shown in FIGS. 9A-9C will be described in detail in another preferred embodiment.

As illustrated mainly in FIG. 2A and FIG. 4, the first connecting conductor 26A and the second connecting conductor 26B are respectively the first lateral surface conductor 26A covering the first lateral surface and the second lateral surface conductor 26B covering the second lateral surface, the lateral surfaces being a pair of lateral surfaces that is opposite in the length direction L of the base portion 21, and each include a plurality of conductive layers. The first lateral surface conductor 26A is connected with the first upper surface conductor 24A and the first lower surface conductor 25A on the first lateral surface of the base portion 21. The second lateral surface conductor 26B is connected with the second upper surface conductor 24B and the second lower surface conductor 25B on the second lateral surface of the base portion 21.

As illustrated mainly in FIG. 2B and FIG. 4, the third connecting conductor 26C and the fourth connecting conductor 26D are respectively the third lateral surface conductor 26C covering the third lateral surface and the fourth lateral surface conductor 26D covering the fourth lateral surface, the lateral surfaces being a pair of lateral surfaces that is opposite in the length direction W of the base portion 21, and each include a plurality of conductive layers. The third lateral surface conductor 26C is connected with the third upper surface conductor 24C and the third lower surface conductor 25C on the third lateral surface of the base portion 21. The fourth lateral surface conductor 26D is connected with the fourth upper surface conductor 24D and the fourth lower surface conductor 25D on the fourth lateral surface of the base portion 21.

The first connecting conductor 26A to the fourth connecting conductor 26D may include a via conductor that penetrates inside the base portion 21 along the height direction H rather than being disposed on the surface of the base portion 21. In that case, the mounting area of the composite electronic component 1A is able to be reduced.

Here, any of the upper surface conductors including the first upper surface conductor 24A and the second upper surface conductor 24B, and the third upper surface conductor 24C and the fourth upper surface conductor 24D is divided into the portion not covered with the protective film 23 and the portion covered with the protective film 23. The portion not covered with the protective film 23 in each upper surface conductor includes a plurality of conductive layers including an underlying conductive layer and bilayered covering conductive layers. Any of the first lower surface conductor 25A to the fourth lower surface conductor 25D, and the first lateral surface conductor 26A to the fourth lateral surface conductor 26D includes a plurality of conductive layers including an underlying conductive layer and bilayered covering conductive layers. The underlying conductive layer is a sintered metal layer, and is specifically, a sintered metal layer including Cu formed by baking a paste including Cu and glass. The bilayered covering conductive layers are a plating layer including Ni formed by a plating treatment, and a plating layer including Sn that covers the same, respectively.

On the other hand, the portion covered with the protective film 23 in each upper surface conductor does not include the bilayered covering conductive layers, and is defined exclusively by an underlying conductive layer. This is achievable by covering a portion of each upper surface conductor with the protective film 23 after formation of the underlying conductive layer and before formation of the covering conductive layers as will be described later.

The sintered metal layer including Cu is a thick film formed by a thick film formation process in which a paste including Cu and glass is baked, and the thickness thereof is, for example, about 10 μm to 30 μm inclusive. The total thickness of the plating layer including Ni and the plating layer including Sn is, for example, 3 μm to 30 μm inclusive. As the underlying conductive layer, besides the sintered metal layer including Cu, a sintered metal layer including Ag or the like can be used. On the other hand, the material of the covering conductive layer can be appropriately selected depending on the joint material, and is selected from, for example, Cu, Ag, Au, Ni, Sn and so on.

The resistor 22 is located between the region where the first upper surface conductor 24A is provided and the region where the second upper surface conductor 24B is provided in the length direction L, and in plan view from the height direction H, one end in the width direction W of the resistor 22 overlaps a portion of the third upper surface conductor 24C, and the other end in the width direction W of the resistor 22 overlaps a portion of the fourth upper surface conductor 24D. As a result, the third upper surface conductor 24C and the fourth upper surface conductor 24D are connected with the resistor 22.

While the size of the resistance element 20A is not particularly limited, as one example, the dimension thereof in the length direction L is about 0.60 mm, the dimension thereof in the width direction W is about 0.30 mm and the dimension thereof in the height direction H is about 0.14 mm.

Figure 5:
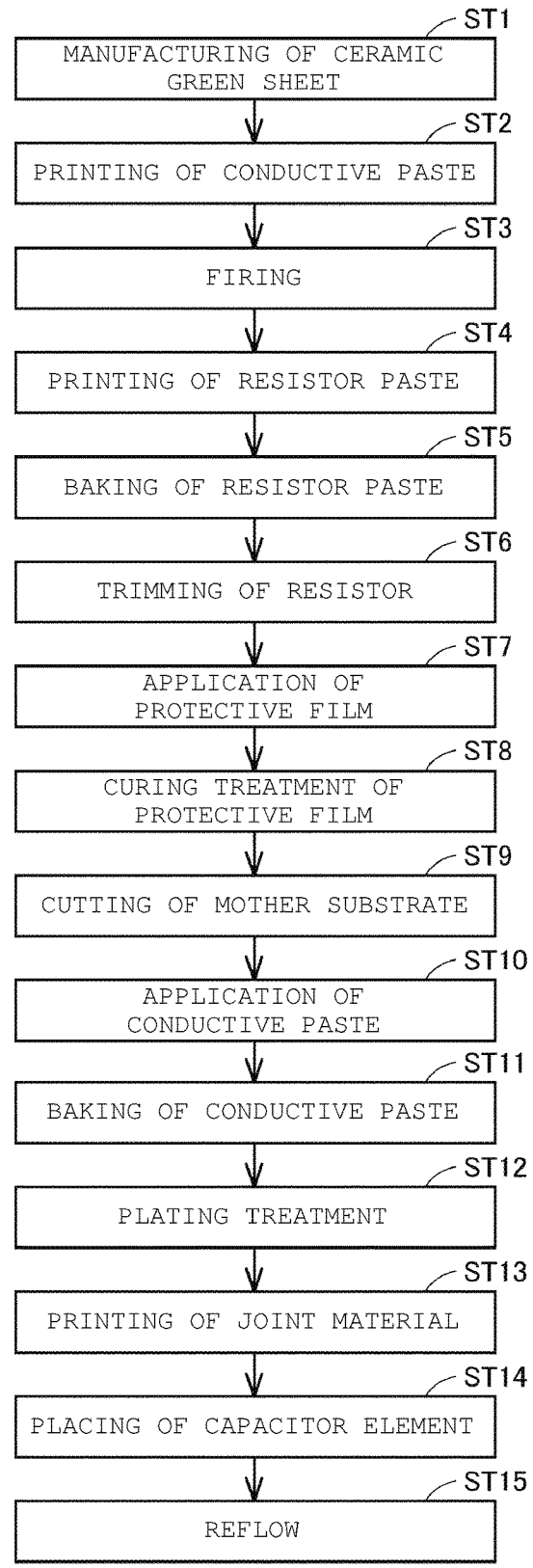
FIG. 5 is a chart showing the production flow of the composite electronic component shown in FIG. 1.

The resistance element 20A may lack the fourth upper surface conductor 24D and include only the three upper surface conductors: the first upper surface conductor 24A to the third upper surface conductor 24C on the upper surface of the base portion 21. In this case, the resistor 22 is connected with the first upper surface conductor 24A or the second upper surface conductor 24B in place of the fourth upper surface conductor 24D. Also in this case, the resistance element 20A may lack the fourth lower surface conductor 25D and the fourth via conductor 26D FIG. 5 is a flowchart for illustrating a production process of the composite electronic component 1A shown in FIG. 1. Hereinafter, referring to FIG. 5, a production process of the composite electronic component 1A according to the present preferred embodiment will be described.

Among the production steps described below, the step of manufacturing the resistance element 20A is for the case where an assembly in which multiple resistance elements 20A is integrated is preliminarily prepared, and the assembly is disassembled to manufacture the plurality of resistance elements 20A collectively. Moreover, the manufacturing flow of the resistance element 20A is not limited to this.

As illustrated in FIG. 5, first, a ceramic green sheet is manufactured (Step ST1). Specifically, by mixing a ceramic powder, a binder resin and a solvent or the like in a predetermined mixing ratio, a ceramic slurry is prepared. The ceramic slurry is applied in a sheet form on the carrier film by dye coating, gravure coating, microgravure coating, screen printing, spray coating or the like, and thus a ceramic green sheet is formed. The formed ceramic green sheet is to become a mother substrate which is an assembly of the resistance elements 20A, and also to become the base portion 21 of the resistance element 20A.

Next, a conductive paste is printed (Step ST2). Specifically, on the upper surface and the lower surface of the ceramic green sheet, a Cu paste is printed as a conductive paste by a screen printing method, a gravure printing method or the like. As a result, on the upper surface of the ceramic green sheet, a conductive pattern of a predetermined shape formed of a Cu paste which is to become the underlying conductive layers of the first upper surface conductor 24A to the fourth upper surface conductor 24D is formed such that further, and on the lower surface of the ceramic green sheet, a conductive pattern of a predetermined shape formed of a Cu paste which is to become the underlying conductive layers of the first lower surface conductor 25A to the fourth lower surface conductor 25D is formed.

Next, firing is conducted (Step ST3). Specifically, the good in process up to then is heated to a predetermined temperature, and thus a sintering treatment for the ceramic green sheet and the conductive pattern formed of a Cu paste printed on the ceramic green sheet is conducted. As a result, the ceramic green sheet turns into a hard mother substrate, and the conductive pattern turns into a sintered metal layer. In this manner, the mother substrate is formed with underlying conductive layers which are to become part of the first upper surface conductor 24A to the fourth upper surface conductor 24D, and the first lower surface conductor 25A to the fourth lower surface conductor 25D.

Then a resistor paste is printed (Step ST4). Specifically, on the upper surface of the mother substrate, a resistor paste is printed by using a screen printing method, a gravure printing method or the like. As a result, on the upper surface of the mother substrate, a resistor pattern formed of the resistor paste is formed. At that time, printing is conducted in such a manner that these resistor patterns overlap a portion of the underlying conductive layers which are to become the third upper surface conductor 24C and the fourth upper surface conductor 24D.

Next, the resistor paste is baked (Step ST5). Specifically, the good in process up to then is heated to a predetermined temperature, and thus a sintering treatment for the resistor paste printed on the mother substrate is conducted. As a result, the resistor pattern is baked to the mother substrate, and thus the mother substrate is formed with the resistor 22.

Next, trimming of the resistor is conducted (Step ST6). Specifically, the resistor 22 is irradiated with laser light to remove a portion thereof, and thus the resistance of the resistor 22 is adjusted.

Next, a protective film is applied (Step ST7), and then a curing treatment of the protective film is conducted (Step ST8). Specifically, the protective film 23 is applied in such a manner that it covers the resistor 22 and a portion of the underlying conductive layers which are to become the third upper surface conductor 24C and the fourth upper surface conductor 24D connected with the resistor 22. Thereafter, the good in process up to then is heated to a predetermined temperature, and thus the protective film 23 is cured in the condition that it adheres to the mother substrate.

Next, the mother substrate is cut (Step ST9). Specifically, the mother substrate is cut along a predetermined cutting line by press-cutting or dicing, and thus individual resistance elements 20A are cut out.

Next, a conductive paste is applied (Step ST10), and sequentially the applied conductive paste is baked (Step ST11). Specifically, on the whole surface of each of the first lateral surface and the second lateral surface of the base portion 21 of each of the cut out individual resistance elements 20A and on a portion of the region of each of the third lateral surface and the fourth lateral surface, a Cu paste is applied as a conductive paste. Thereafter, the good in process up to then is heated to a predetermined temperature, and thus a sintering treatment for the conductive pattern is conducted. As a result, the conductive pattern turns into a sintered metal layer. In this manner, the mother substrate is formed with underlying conductive layers that are to become part of the first lateral surface conductor 26A to the fourth lateral surface conductor 26D.

Next, a plating treatment is conducted (Step ST12). Specifically, by dipping the good in process up to then in a Ni plating bath and an Sn plating bath sequentially, a plating treatment on the underlying conductive layers provided on the resistance element 20A is conducted, and the covering conductive layers are formed. In this manner, these underlying conductive layers are covered with a plating layer including Ni, and the plating layer including Ni is covered with a plating layer including Sn. As a result, the first upper surface conductor 24A to the fourth upper surface conductor 24D, the first lower surface conductor 25A to the fourth lower surface conductor 25D, and the first lateral surface conductor 26A to the fourth lateral surface conductor 26D are respectively formed. In this manner, the manufacturing of the resistance element 20A is completed.

Next, a joint material is printed on the resistance element 20A (Step ST13), and then the capacitor element 10 is placed (Step ST14). Specifically, the first joint material 31 and the second joint material 32 formed of a solder paste are printed by a screen printing method or the like in such a manner that they cover the first upper surface conductor 24A and the second upper surface conductor 24B, and the capacitor element 10 is placed in such a manner that the first external electrode 14A and the second external electrode 14B are placed on the first joint material 31 and the second joint material 32.

Next, a reflow is conducted (Step ST15). Specifically, soldering is conducted by putting the good in process up to then into a reflow oven or the like, and the first upper surface conductor 24A and the first external electrode 14A are joined by the first joint material 31, and the second upper surface conductor 24B and the second external electrode 14B are joined by the second joint material 32. As a result, the capacitor element 10 is mounted on the resistance element 20A, and production of the composite electronic component 1A according to the present preferred embodiment is completed.

The production flow of the composite electronic component 1A described in the above is merely illustrative, and the composite electronic component 1A according to the present preferred embodiment can be produced according to other production process.

As described above, the composite electronic component 1A according to the present preferred embodiment includes not only the first upper surface conductor 24A and the second upper surface conductor 24B provided to join with the capacitor element 10 on the upper surface 21a of the base portion 21 of the resistance element 20A, but also a functional portion including the resistor 22, the protective film 23 and the third upper surface conductor 24C and the fourth upper surface conductor 24D disposed between the first upper surface conductor 24A and the second upper surface conductor 24B. Therefore, if no measure is taken, the functional portion may come into contact with the capacitor element 10 when the capacitor element 10 is mounted on the resistance element 20A as described above. And when such a contact occurs, the defective connection may occur as described above.

Therefore, in the composite electronic component 1A according to the present preferred embodiment, by employing the later-described structure, occurrence of such defective connection is significantly reduced or prevented. FIG. 6A is an enlarged schematic section view of a region VIA indicated by a broken line in FIG. 2A, and FIG. 6B is an enlarged schematic section view of a region VIB indicated by a broken line in FIG. 2B.

As illustrated in FIG. 6A, in the composite electronic component 1A according to the present preferred embodiment, the dimension in the height direction H (height) h1 from the upper surface 21a of the base portion 21 of the resistance element 20A to an exposed surface of an end portion 23a which is one of the pair of end portions in the length direction L of the protective film 23 is smaller than the dimension in the height direction H (height) h0 from the upper surface 21a of the base portion 21 of the resistance element 20A to an exposed surface in a center portion 23c of the protective film 23. Also, the dimension in the height direction H (height) h2 from the upper surface 21a of the base portion 21 of the resistance element 20A to an exposed surface of an end portion 23b which is the other of the pair of end portions in the length direction L of the protective film 23 is smaller than the dimension in the height direction H (height) h0 from the upper surface 21a of the base portion 21 of the resistance element 20A to an exposed surface in the center portion 23c of the protective film 23. That is, h1<h0 and h2<h0 are satisfied. Here, the end portion 23a and the end portion 23b of the protective film 23 are the portions located in the periphery of the resistor 22 in the protective film 23, namely the portion that is in contact with the upper surface 21a of the base portion 21 and directly covers the base portion 21, and occasionally the portion covering the peripheral portion of the resistor 22 in addition to the above. The center portion 23c of the protective film 23 is the center of the protective film 23 in plan view from the height direction H.

The first external electrode 14A and the second external electrode 14B of the capacitor element 10 mounted on the resistance element 20A expands from the capacitor body 11 toward the resistance element 20A along the height direction H. When the capacitor element 10 is mounted on the resistance element 20, in the plane coordinates of the length direction L and the width direction W seen from the height direction H, the first external electrode 14A disposed on the lower surface 11a of the capacitor body 11 of the capacitor element 10 and the end portion 23a of the protective film 23 disposed on the upper surface 21a of the base portion 21 of the resistance element 20A overlap each other. Similarly, the second external electrode 14B disposed on the lower surface 11a of the capacitor body 11 of the capacitor element 10 and the end portion 23b of the protective film 23 disposed on the upper surface 21a of the base portion 21 of the resistance element 20A overlap each other.

Therefore, by structuring the dimension in the height direction H in each portion of the protective film 23 as described above, it is possible to reduce the possibility that the end portion 23a of the protective film 23 comes into contact with the first external electrode 14A, and it is possible to reduce the possibility that the end portion 23b of the protective film 23 comes into contact with the second external electrode 14B. As a result, the occurrence of the defective connection is able to be effectively reduced or prevented.

The protective film 23 is generally formed by applying an inorganic material or a resin material in the liquid form on the upper surface 21a of the base portion 21 to cover the resistor 22, and then curing the inorganic material or the resin material in the liquid form. Therefore, by diversely varying the choice of material, the applying method, the curing condition and the like in forming the protective film 23, it is possible to adjust the shape of the peripheral portion of the protective film 23 including the end portion 23a and the end portion 23b. In other words, by adjusting the shape of the peripheral portion of the protective film 23 including the end portion 23a and the end portion 23b, the structure is realized.

Although a specific shape of the end portion 23a and the end portion 23b of the protective film 23 is not particularly limited as long as the structure of the dimension in the height direction H of each portion as described above is satisfied, it is preferred that the dimension h1 of the end portion 23a of the protective film 23 and the dimension h2 of the end portion 23b decrease as the distance from the center portion 23c of the protective film 23 along the length direction L increases. As an example of this shape, the shape as illustrated in FIG. 6A in which the dimension h1 of the end portion 23a and the dimension h2 of the end portion 23b of the protective film 23 gradually decrease as they become more distant from the center portion 23c of the protective film 23 along the length direction L can be used. Besides this, the shapes as in the later-described first modified example and the second modified example can be used. By using such a shape, it is possible to significantly reduce or prevent the occurrence of the defective connection more effectively.

Also as illustrated in FIG. 6A, in the composite electronic component 1A according to the present preferred embodiment, the dimension in the height direction H (thickness) T0 of the resistor 22 is smaller than the dimension in the height direction H (thickness) T1 of the portion located on the lower surface 11a of the capacitor body 11 of the first external electrode 14A, and is smaller than the dimension in the height direction H (thickness) T2 of the portion located on the lower surface 11a of the capacitor body 11 of the second external electrode 14B. That is, T0<T1 and T0<T2 are satisfied.

In mounting the capacitor element 10 on the resistance element 20A, the larger the thicknesses of the first external electrode 14A and the second external electrode 14B disposed on the lower surface 11a of the capacitor body 11, and the smaller the thickness of the resistor 22, the larger distance between the region where the capacitor body 11 is exposed on the lower surface 11a and the protective film 23 is able to be ensured. Therefore, it is possible to significantly reduce or prevent the occurrence of the defective connection more effectively.

As a structure that realizes the dimensional requirements of the height direction H of the resistor 22, and the first external electrode 14A and the second external electrode 14B, the structure as in later-described Preferred Embodiment 3 can be used besides the structure shown in the present preferred embodiment.

Here, to significantly reduced or prevent the occurrence of the defective connection between the capacitor element 10 and the resistance element 20A more securely, it is preferred that the dimension T0 in the height direction H of the resistor 22 is smaller than both of the dimension in the height direction H (thickness) of the first upper surface conductor 24A indicated as dimension H1 in FIG. 6A and FIG. 6B, and the dimension in the height direction H (thickness) of the second upper surface conductor 24B indicated as dimension H2 in FIG. 6A and FIG. 6B.

Also to significantly reduced or prevent the occurrence of the defective connection more securely, it is preferred that the dimension in the height direction H of the center portion 23c of the protective film 23 is smaller than both the dimension T1 in the height direction H of the portion covering the lower surface 11a of the capacitor body 11 of the first external electrode 14A, and the dimension T2 in the height direction H of the portion covering the lower surface 11a of the capacitor body 11 of the second external electrode 14B.

To significantly reduced or prevent the occurrence of the defective connection between the capacitor element 10 and the resistance element 20A more securely, it is preferred that the maximum height in the height direction H from the upper surface 21a of the base portion 21 to the exposed surface of the protective film 23 is smaller than both of the dimension T1 in the height direction H of the portion covering the lower surface 11a of the capacitor body 11 of the first external electrode 14A and the dimension T2 in the height direction H of the portion covering the lower surface 11a of the capacitor body 11 of the second external electrode 14B.

To significantly reduced or prevent the occurrence of the defective connection more securely, it is preferred that in the section of the resistance element 20A that is perpendicular or substantially perpendicular to the width direction W, where the third upper surface conductor 24C or the fourth upper surface conductor 24D is exposed, the maximum height in the height direction H from the upper surface 21a of the base portion 21 to the exposed surface of the protective film 23 is smaller than the sum of the dimension T1 and the dimension H1 shown in FIG. 6A and FIG. 6B which is the total thickness of the first external electrode 14A and the first upper surface conductor 24A on the lower surface 11a of the capacitor body 11, and is smaller than the sum of the dimension T2 and the dimension H2 shown in FIG. 6A and FIG. 6B which is the total thickness of the second external electrode 14B and the second upper surface conductor 24B on the lower surface 11a of the capacitor body 11.

Also as illustrated in FIG. 6A and FIG. 6B, in the composite electronic component 1A according to the present preferred embodiment, the dimension in the height direction H (height) H1 from the upper surface 21a of the base portion 21 to the surface of the first upper surface conductor 24A is higher than the dimension (height) H3 from the upper surface 21a of the base portion 21 to the surface of the portion in the third upper surface conductor 24C overlapped with the protective film 23 in the height direction H, and is higher than the dimension (height) H4 from the upper surface 21a of the base portion 21 to the surface of the portion in the fourth upper surface conductor 24D overlapped with the protective film 23 in the height direction H. That is, H3<H1 and H4<H1 are satisfied. Also, the dimension in the height direction H (height) H2 from the upper surface 21a of the base portion 21 to the surface of the second upper surface conductor 24B is higher than the dimension (height) H3 from the upper surface 21a of the base portion 21 to the surface of the portion in the third upper surface conductor 24C overlapped with the protective film 23 in the height direction H, and is higher than the dimension (height) H4 from the upper surface 21a of the base portion 21 to the surface of the portion in the fourth upper surface conductor 24D overlapped with the protective film 23 in the height direction H. That is, H3<H2 and H4<H2 are satisfied.

This is because while the first upper surface conductor 24A and the second upper surface conductor 24B include the bilayered covering conductive layers 24b and 24c, the portions in the third upper surface conductor 24C and fourth upper surface conductor 24D that are covered with the protective film 23 do not include the covering conductive layers as described above by referring to FIG. 6A and FIG. 6B. That is, by the amount corresponding to the thickness of the bilayered covering conductive layers 24b and 24c, the portions in the third upper surface conductor 24C and the fourth upper surface conductor 24D covered with the protective film 23 are thinner than the first upper surface conductor 24A and the second upper surface conductor 24B.

With such a structure, the height of the functional portion as a whole is controlled low by the amount by which the portions in the third upper surface conductor 24C and the fourth upper surface conductor 24D that are covered with the protective film 23 are thinner. Also it is possible to increase the distance between the functional portion and the capacitor body 11 of the capacitor element 10 by the amount by which the first upper surface conductor 24A and the second upper surface conductor 24B are thicker. Therefore, it is possible to reduce the possibility that the functional portion of the resistance element 20A comes into contact with the capacitor element 10, and it is possible to significantly reduced or prevent the occurrence of the defective connection effectively.

As a structure that realizes the dimensional requirements of the height direction H of the first upper surface conductor 24A to the fourth upper surface conductor 24D, the structure as in later-described Preferred Embodiments 3 and 4 and the third modified example can be used besides the structure shown in the present preferred embodiment.

Also as illustrated in FIG. 6A, in the composite electronic component 1A according to the present preferred embodiment, the distance between the inner end of the first external electrode 14A and the inner end of the second external electrode 14B in the length direction L is designated as L1, the distance between the inner end of the first upper surface conductor 24A and the inner end of the second upper surface conductor 24B in the length direction L is designated as L2, the dimension of the resistor 22 in the length direction L is designated as L3, and the dimension of the protective film 23 in the length direction L is designated as L4. At this time, when the distance L1 is smaller than the distance L2, and the dimension L3 and the dimension L4 are larger than the distance L1, the first external electrode 14A can overlap the third upper surface conductor 24C and the fourth upper surface conductor 24D in the height direction H, or the second external electrode 14B can overlap the third upper surface conductor 24C and the fourth upper surface conductor 24D. In other words, L1<L2, L1<L3 and L1<L4 are satisfied. Also in such a case, by particularly satisfying the requirements of h1<h0 and h2<h0, it is possible to reduce the possibility that the functional portion of the resistance element 20A comes into contact with the first external electrode 14A or the second external electrode 14B of the capacitor element 10.

For further reducing the possibility that the functional portion of the resistance element 20A comes into contact with the first external electrode 14A and the second external electrode 14B of the capacitor element 10, it is preferred that the distance L1 is larger than the distance L2, and/or the dimension L3 and the dimension L4 are smaller than the distance L1.

First and Second Modified Examples

Figure 7A:
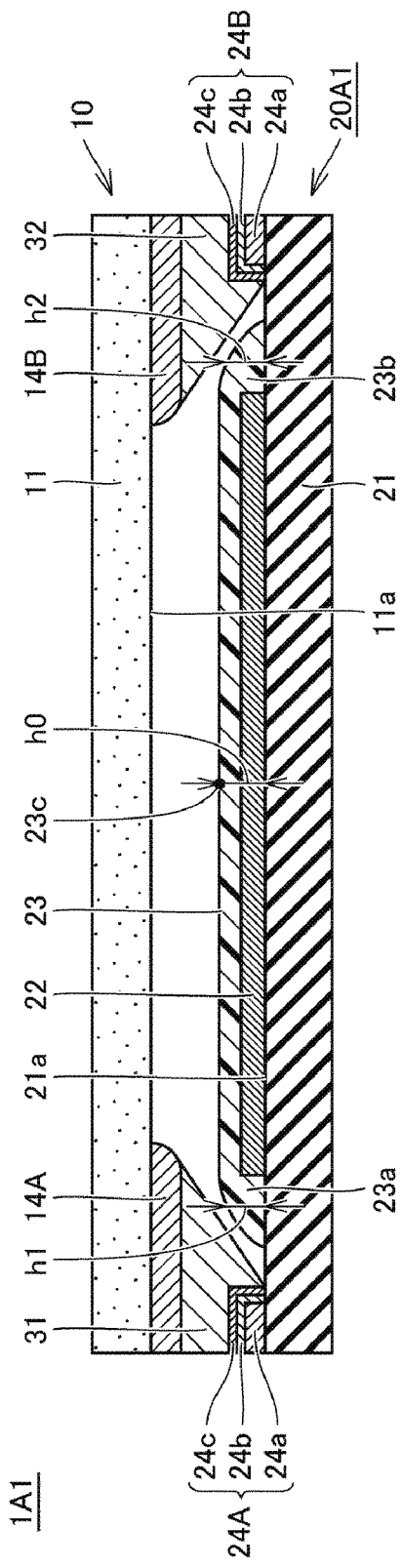
FIGS. 7A and 7B are enlarged schematic section views of portions of the composite electronic components according to the first and the second modified examples of a preferred embodiment of the present invention.
Figure 7B:
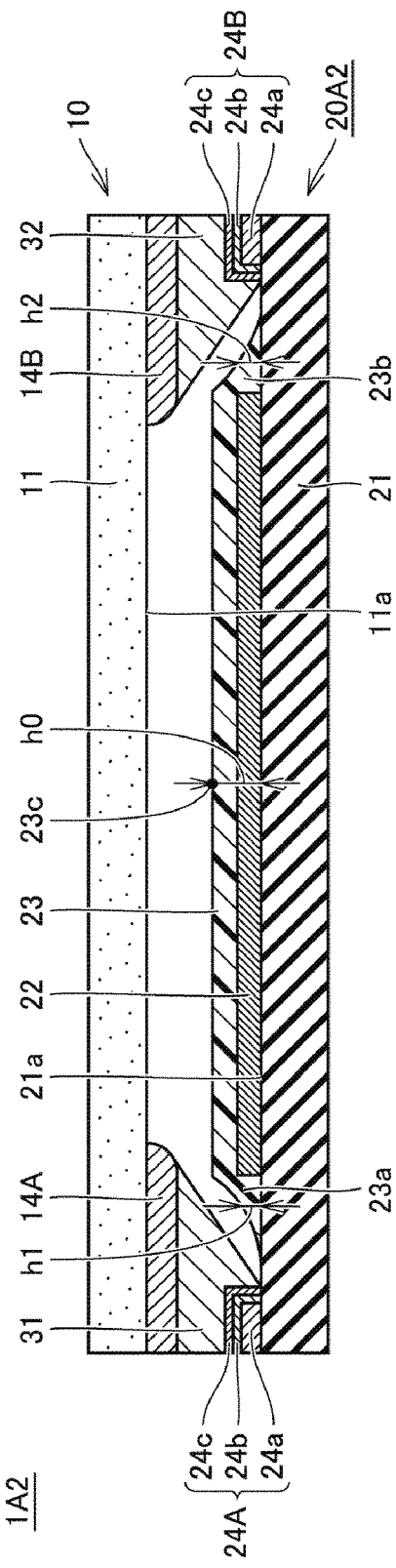

In FIG. 7A and FIG. 7B, FIG. 7A is an enlarged schematic section view of a portion of a composite electronic component 1A1 according to the first modified example, and FIG. 7B is an enlarged schematic section view of a portion of a composite electronic component 1A2 according to the second modified example. Hereinafter, referring to FIG. 7A and FIG. 7B, the composite electronic component 1A1 according to the first modified example, and the composite electronic component 1A2 according to the second modified example based on the present preferred embodiment will be described.

As illustrated in FIG. 7A, the composite electronic component 1A1 according to the first modified example includes a resistance element 20A1 including a structure different from that of the composite electronic component 1A. In the resistance element 20A1, the shape of the pair of end portions 23a and 23b of the protective film 23 in the length direction L is different from that of the resistance element 20A.

Specifically, the dimension h1 of the end portion 23a of the protective film 23 and the dimension h2 of the end portion 23b are lower as they are farther from the center portion 23c of the protective film 23 along the length direction L, and the section shapes of the end portion 23a and the end portion 23b expand convexly toward the side of the first external electrode 14A and the second external electrode 14B, respectively.

Also with such a structure, similarly to the case of the composite electronic component 1A, it is possible to reduce the possibility that the functional portion of the resistance element 20A1 comes into contact with the first external electrode 14A and the second external electrode 14B of the capacitor element 10 in mounting the capacitor element 10 on the resistance element 20A1, and it is possible to effectively reduce or prevent the occurrence of the defective connection.

As illustrated in FIG. 7B, the composite electronic component 1A2 according to the second modified example includes a resistance element 20A2 including a structure different from that of the composite electronic component 1A. In the resistance element 20A2, the shape of the pair of end portions 23a and 23b of the protective film 23 in the length direction L is different from that of the resistance element 20A.

Specifically, the dimension h1 of the end portion 23a of the protective film 23 and the dimension h2 of the end portion 23b are lower as they are farther from the center portion 23c of the protective film 23 along the length direction L, and the section shapes of the end portion 23a and the end portion 23b are recessed concavely toward the opposite side of the first external electrode 14A and the second external electrode 14B, respectively.

Also with such a structure, similarly to the case of the composite electronic component 1A, it is possible to reduce the possibility that the functional portion of the resistance element 20A2 comes into contact with the first external electrode 14A and the second external electrode 14B of the capacitor element 10 in mounting the capacitor element 10 on the resistance element 20A2, and it is possible to effectively reduce or prevent the occurrence of the defective connection.

In comparison between the first modified example and the second modified example, the effect of significantly reducing or preventing the occurrence of the defective connection is larger in the second modified example in which a larger distance between the end portion 23a of the protective film 23 and the first external electrode 14A, and a larger distance between the end portion 23b of the protective film 23 and the second external electrode 14B is able to be ensured.

Preferred Embodiment 2

Figure 8A:
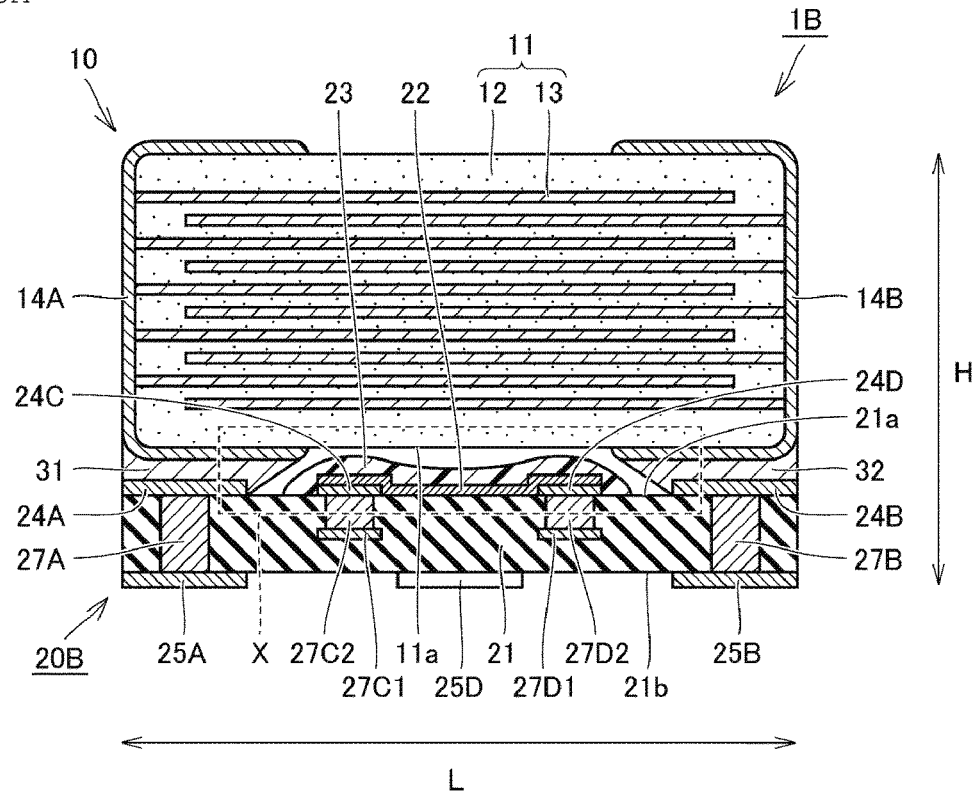
FIGS. 8A and 8B is a schematic section view of a composite electronic component according to Preferred Embodiment 2 of the present invention.
Figure 8B:
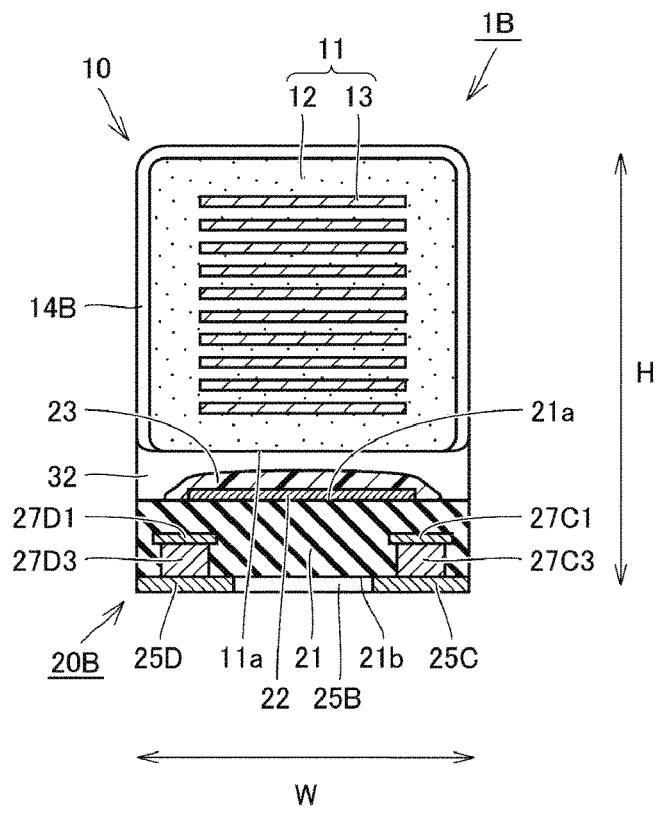
Figure 10:
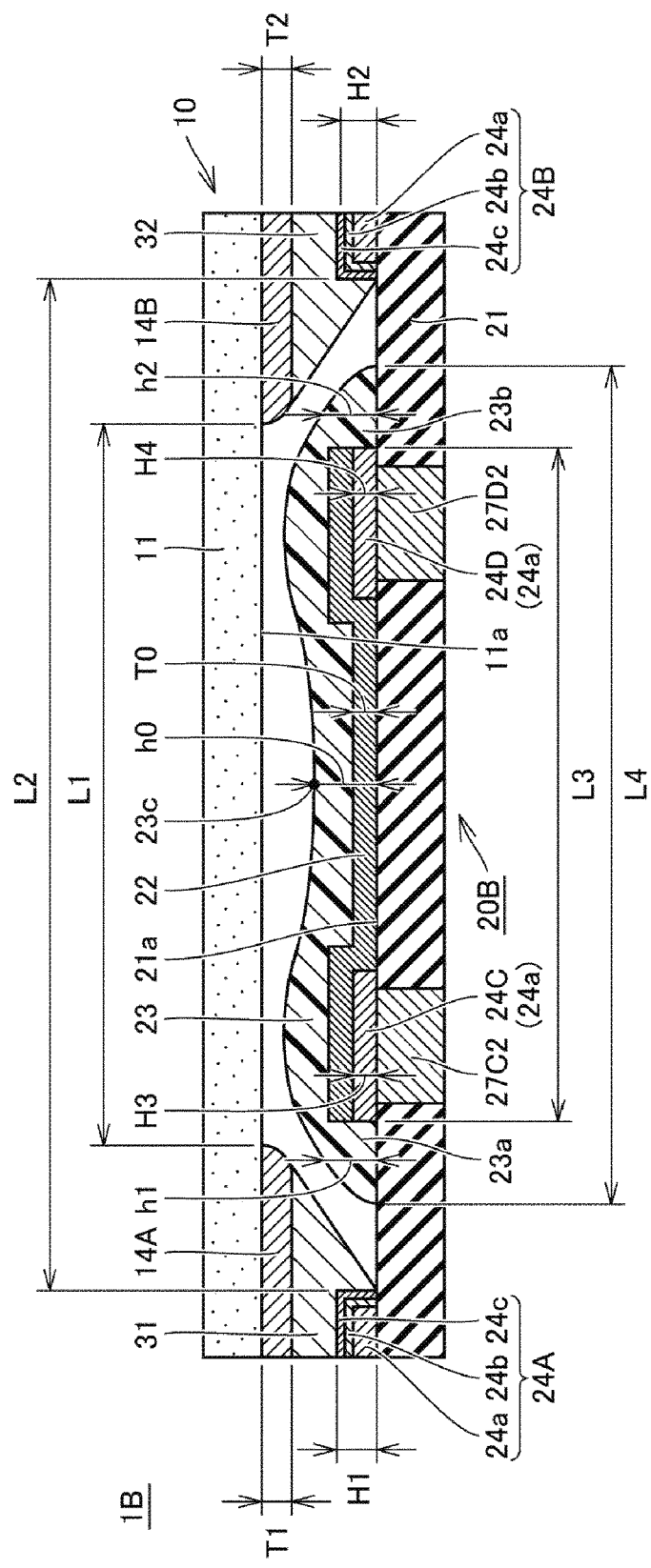
FIG. 10 is an enlarged schematic section view of the portion of the resistance element shown in FIG. 8A and FIG. 8B.

FIG. 8A and FIG. 8B are schematic section views of a composite electronic component 1B according to Preferred Embodiment 2 of the present invention. FIG. 9A to FIG. 9C are a schematic top view, a schematic section view and a schematic bottom view of a resistance element 20B shown in FIG. 8, respectively. FIG. 10 is an enlarged schematic section view of a region X indicated by a broken line in FIG. 8A. Hereinafter, referring to FIG. 8A to FIG. 10, the composite electronic component 1B according to the present preferred embodiment will be described.

As illustrated in FIG. 8A, FIG. 8B and FIG. 9, the composite electronic component 1B according to the present preferred embodiment includes the resistance element 20B including a structure different from that of the composite electronic component 1A. The resistance element 20B is different from the resistance element 20A in the arrangement of the third upper surface conductor 24C and the fourth upper surface conductor 24D, and accordingly also different in the structure of the first connecting conductor 26A to the fourth connecting conductor 26D.

Specifically, in the composite electronic component 1B according to the present preferred embodiment, the base portion 21 of the resistance element 20B includes a LTCC substrate in which bilayered ceramic green sheets are laminated and integrated, and as a result, an internal connecting conductor 27C1 and an internal connecting conductor 27D1 are embedded wiring layers inside the base portion 21.

Also on the first lateral surface to the fourth lateral surface of the base portion 21 of the resistance element 20B, the first lateral surface conductor 26A to the fourth lateral surface conductor 26D are not provided unlike the case of the resistance element 20A, and via conductors penetrating the base portion 21 in the height direction H are provided instead. These via conductors mainly define the first connecting conductor to the fourth connecting conductor.

The first upper surface conductor 24A and the first lower surface conductor 25A are connected via a first via conductor 27A that penetrates the base portion 21 in the height direction H, and the second upper surface conductor 24B and the second lower surface conductor 25B are connected via a second via conductor 27B that penetrates the base portion 21 in the height direction H.

The third upper surface conductor 24C and the fourth upper surface conductor 24D are located between the first upper surface conductor 24A and the second upper surface conductor 24B in the length direction L, and are separated from each other by a distance of, for example, about 0.14 mm in the length direction L. Here, each of the third upper surface conductor 24C and the fourth upper surface conductor 24D preferably have a rectangular shape wherein the dimension in the length direction L is smaller than the dimension in the width direction W when the resistance element 20B is planarly viewed along the height direction H. The dimension in the width direction W of the third upper surface conductor 24C and the fourth upper surface conductor 24D may be identical to or smaller than the dimension in the width direction W of the first upper surface conductor 24A and the second upper surface conductor 24B.

The dimension in the length direction L of each of the first upper surface conductor 24A and the second upper surface conductor 24B is, for example, about 0.1 mm, and the dimension in the length direction L of the third upper surface conductor 24C and the fourth upper surface conductor 24D is, for example, about 0.06 mm. Preferably, the dimension in the length direction L of the first upper surface conductor 24A and the second upper surface conductor 24B is larger than the dimension in length direction L of the third upper surface conductor 24C and the fourth upper surface conductor 24D. In that case, it is possible to improve the bonding strength between the capacitor element 10 and the resistance element 20B, and it is possible to improve the degree of freedom to adjust the electric characteristics of the resistor 22 because the area of the resistor 22 is broader.

Also the distance in the length direction L between the first upper surface conductor 24A and the third upper surface conductor 24C, and the distance in the length direction L between the second upper surface conductor 24B and the fourth upper surface conductor 24D each are, for example, about 0.07 mm, and the distance in the length direction L between the third upper surface conductor 24C and the fourth upper surface conductor 24D is, for example, about 0.14 mm. Preferably, the distance in the length direction L between the first upper surface conductor 24A and the third upper surface conductor 24C, and the distance in the length direction L between the second upper surface conductor 24B and the fourth upper surface conductor 24D are smaller than the distance in the length direction L between the third upper surface conductor 24C and the fourth upper surface conductor 24D. In that case, since the area of the resistor 22 is broader, it is possible to improve the degree of freedom to adjust the electric characteristics of the resistor 22.

The resistor 22 is located between the first upper surface conductor 24A and the second upper surface conductor 24B in the length direction L, and one end in the length direction L covers a portion of the third upper surface conductor 24C and the other end covers a portion of the fourth upper surface conductor 24D. As a result, the third upper surface conductor 24C and the fourth upper surface conductor 24D are connected with the resistor 22.

Any of the resistor 22 and the third upper surface conductor 24C and the fourth upper surface conductor 24D are completely covered with the protective film 23, and are not exposed at all on the upper surface 21a of the base portion 21.

Here, in the composite electronic component 1B according to the present preferred embodiment, since the area of the resistor 22 in plan view from the height direction H is able to be ensured still largely in comparison with the case of the composite electronic component 1A according to the Preferred Embodiment 1, the degree of freedom of adjustment of electric characteristics of the resistor 22 is further improved.

When the third upper surface conductor 24C and the fourth upper surface conductor 24D are separated from each other in the length direction L, the region where the third upper surface conductor 24C and the third lower surface conductor 25C overlap is small, and the region where the fourth upper surface conductor 24D and the fourth lower surface conductor 25D overlap is small in plan view from the height direction H.

Also in such a case, by providing the third connecting conductor and the fourth connecting conductor with a via conductor extending in the height direction H inside the base portion 21 and with an internal connecting conductor extending in the direction perpendicular or substantially perpendicular to the height direction H inside the base portion 21, it is possible to connect the third upper surface conductor 24C and the third lower surface conductor 25C, and it is possible to connect the fourth upper surface conductor 24D and fourth lower surface conductor 25D.

That is, in the composite electronic component 1B, the third via conductor connecting the third upper surface conductor 24C and the third lower surface conductor 25C includes the internal connecting conductor 27C1, an upper via conductor 27C2 and a lower via conductor 27C3. In plan view along the height direction H, the internal connecting conductor 27C1 has a L shape extending in the length direction L and the width direction W inside the base portion 21. The upper via conductor 27C2 is connected with the internal connecting conductor 27C1 and extends in the height direction H from the internal connecting conductor 27C1 toward the upper surface 21a of the base portion 21. The lower via conductor 27C3 is connected with the internal connecting conductor 27C1, and extends in the height direction H from the internal connecting conductor 27C1 toward the lower surface 21b of the base portion 21. Here, in plan view from the height direction H, the upper via conductor 27C2 and the lower via conductor 27C3 do not overlap at least partly.

With such a structure, even when the region where the third upper surface conductor 24C and the third lower surface conductor 25C overlap is small in plan view, it is possible to connect the third upper surface conductor 24C and the third lower surface conductor 25C via the internal connecting conductor 27C1, the upper via conductor 27C2 and the lower via conductor 27C3.

Also in the composite electronic component 1B, the fourth via conductor connecting the fourth upper surface conductor 24D and the fourth lower surface conductor 25D includes an internal connecting conductor 27D1, an upper via conductor 27D2 and a lower via conductor 27D3. The internal connecting conductor 27D1 has a L shape extending in the length direction L and the width direction W inside the base portion 21 in plan view along the height direction H. The upper via conductor 27D2 is connected with the internal connecting conductor 27D1, and extends in the height direction H from the internal connecting conductor 27D1 toward the upper surface 21a of the base portion 21. The lower via conductor 27D3 is connected with the internal connecting conductor 27D1, and extends in the height direction H from the internal connecting conductor 27D1 toward the lower surface 21b of the base portion 21. Here, in plan view from the height direction H, the upper via conductor 27D2 and the lower via conductor 27D3 do not overlap at least partly.

With such a structure, even when the region where the fourth upper surface conductor 24D and the fourth lower surface conductor 25D overlap is small in plan view, it is possible to connect the fourth upper surface conductor 24D and the fourth lower surface conductor 25D via the internal connecting conductor 27D1, the upper via conductor 27D2 and the lower via conductor 27D3.

Therefore, by using the structure, it becomes possible to easily differentiate the arrangement of the third upper surface conductor 24C and the fourth upper surface conductor 24D, from the arrangement of the third lower surface conductor 25C and the fourth lower surface conductor 25D in plan view from the height direction H. As far as it is acceptable in the design, it is preferred that the via conductor which is to reach the upper surface or the lower surface of the base portion and to be exposed on the outer surface of the resistance element is completely overlapped with the upper surface conductor and the lower surface conductor from the view point of mounting stability and prevention of occurrence of short circuit defect.

When the upper via conductor and the lower via conductor overlap in plan view from the height direction H, the upper via conductor and the lower via conductor may be directly connected without forming the internal connecting conductor.

In the composite electronic component 1B according to the present preferred embodiment, any of the first upper surface conductor 24A and the second upper surface conductor 24B, and the first lower surface conductor 25A to the fourth lower surface conductor 25D include a plurality of conductive layers including an underlying conductive layer and bilayered covering conductive layers. The underlying conductive layer is a sintered metal layer including Ag, and the bilayered covering conductive layers include a plating layer including Ni and a plating layer including Au covering the same, respectively.

Meanwhile, the third upper surface conductor 24C and the fourth upper surface conductor 24D lack the bilayered covering conductive layers, and are defined exclusively by an underlying conductive layer, namely a sintered metal layer including Ag.

Here, as illustrated in FIG. 10, also in the composite electronic component 1B according to the present preferred embodiment, likewise the case of the composite electronic component 1A according to Preferred Embodiment 1, the dimension in the height direction H (height) h1 from the upper surface 21a of the base portion 21 of the resistance element 20B to an exposed surface of an end portion 23a which is one of the pair of end portions in the length direction L of the protective film 23 is smaller than the dimension in the height direction H (height) h0 from the upper surface 21a of the base portion 21 of the resistance element 20B to an exposed surface in a center portion 23c of the protective film 23. Also, the dimension in the height direction H (height) h2 from the upper surface 21a of the base portion 21 of the resistance element 20B to an exposed surface of an end portion 23b which is the other of the pair of end portions in the length direction L of the protective film 23 is smaller than the dimension in the height direction H (height) h0 from the upper surface 21a of the base portion 21 of the resistance element 20B to an exposed surface in the center portion 23c of the protective film 23. That is, h1<h0 and h2<h0 are satisfied.

Also, the dimension in the height direction H (thickness) T0 of the resistor 22 is smaller than the dimension in the height direction H (thickness) T1 of the portion located on the lower surface 11a of the capacitor body 11 of the first external electrode 14A, and is smaller than the dimension in the height direction H (thickness) T2 of the portion located on the lower surface 11a of the capacitor body 11 of the second external electrode 14B. That is, T0<T1 and T0<T2 are satisfied.

Also, the dimension in the height direction H (height) H1 from the upper surface 21a of the base portion 21 to the surface of the first upper surface conductor 24A is higher than the dimension (height) H3 from the upper surface 21a of the base portion 21 to the surface of the portion in the third upper surface conductor 24C overlapped with the protective film 23 in the height direction H, and is higher than the dimension (height) H4 from the upper surface 21a of the base portion 21 to the surface of the portion in the fourth upper surface conductor 24D overlapped with the protective film 23 in the height direction H. That is, H3<H1 and H4<H1 are satisfied. Also, the dimension in the height direction H (height) H2 from the upper surface 21a of the base portion 21 to the surface of the second upper surface conductor 24B is higher than the dimension (height) H3 from the upper surface 21a of the base portion 21 to the surface of the portion in the third upper surface conductor 24C overlapped with the protective film 23 in the height direction H, and is higher than the dimension (height) H4 from the upper surface 21a of the base portion 21 to the surface of the portion in the fourth upper surface conductor 24D overlapped with the protective film 23 in the height direction H. That is, H3<H2 and H4<H2 are satisfied.

Therefore, also in the composite electronic component 1B according to the present preferred embodiment, likewise the case of the composite electronic component 1A, it is possible to reduce the possibility that the functional portion of the resistance element 20B including the resistor 22, the protective film 23 and the third upper surface conductor 24C and the fourth upper surface conductor 24D from comes into contact with the capacitor element 10, and it is possible to reduce or prevent the occurrence of the defective connection effectively.

In the composite electronic component 1B according to the present preferred embodiment, the L1 to L4 preferably satisfy the requirement of L3<L1<L4<L2, and thus the resistor 22 does not overlap the first external electrode 14A and the second external electrode 14B in the height direction H. Therefore, it is possible to make the joining area between the first external electrode 14A and the second external electrode 14B, and the first upper surface conductor 24A and the second upper surface conductor 24B large, and it is possible to reduce the possibility that the functional portion of the resistance element 20B comes into contact with the capacitor element 10.

Third Modified Example

Figure 11:
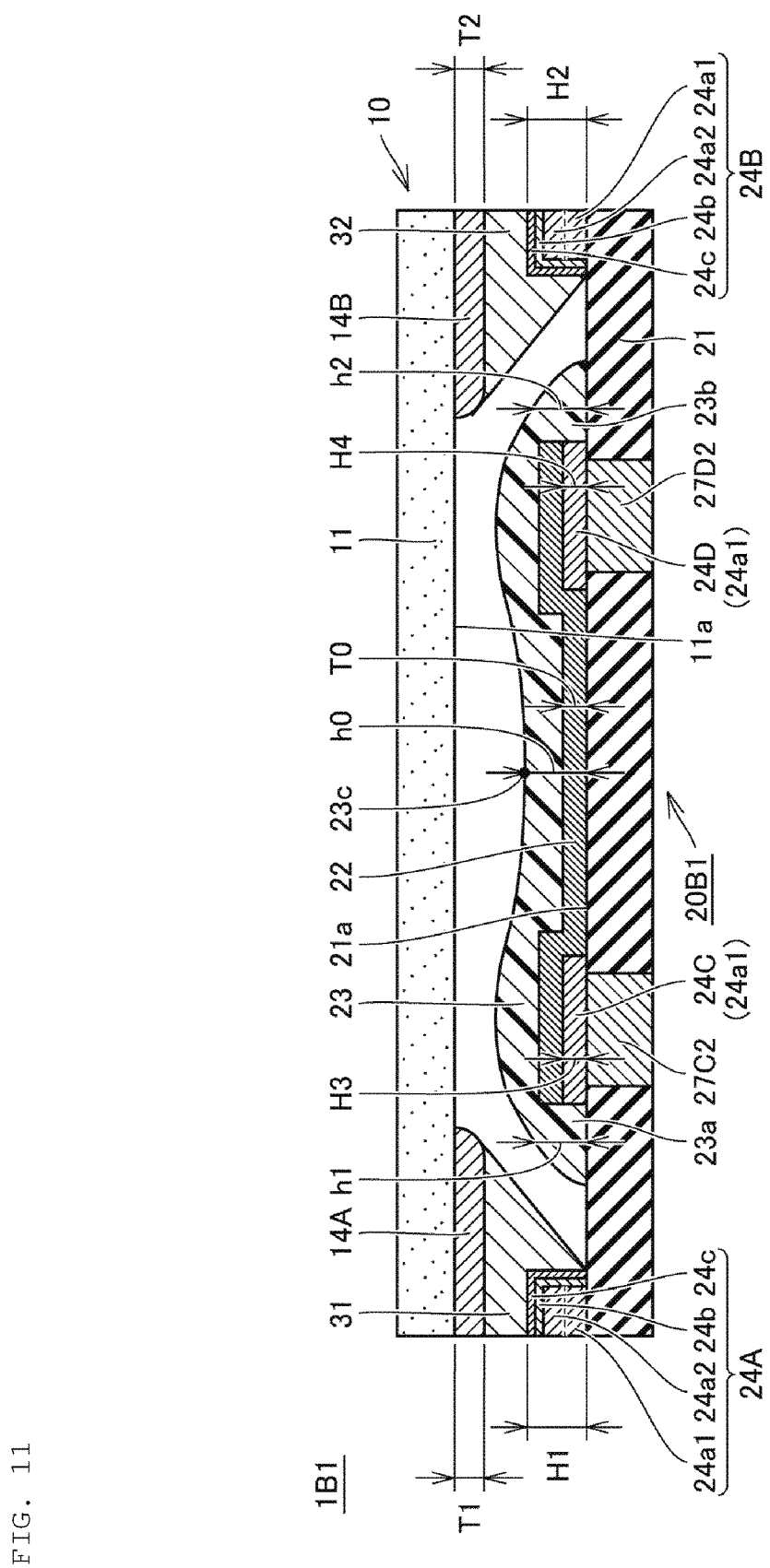
FIG. 11 is an enlarged schematic section view of a portion of a composite electronic component according to the third modified example of a preferred embodiment of the present invention.

FIG. 11 is an enlarged schematic section view of a portion of a composite electronic component 1B1 according to the third modified example. Hereinafter, referring to FIG. 11, the composite electronic component 1B1 according to the third modified example based on the present preferred embodiment will be described.

As illustrated in FIG. 11, the composite electronic component 1B1 according to the third modified example includes a resistance element 20B1 including a structure different from that of the composite electronic component 1B. In the resistance element 20B1, the structure of the first upper surface conductor 24A and the second upper surface conductor 24B is different from that of the resistance element 20B.

Specifically, the first upper surface conductor 24A includes a plurality of conductive layers including bilayered underlying conductive layers 24a1 and 24a2, and bilayered covering conductive layers 24b and 24c. Also the second upper surface conductor 24B includes a plurality of conductive layers similarly to the first upper surface conductor 24A. Here, each of the bilayered underlying conductive layers 24a1 and 24a2 is a sintered metal layer including Ag, and the bilayered covering conductive layers 24b and 24c include a plating layer including Ni, and a plating layer including Au covering the same, respectively.

Of the bilayered underlying conductive layers 24a1 and 24a2, the underlying conductive layer 24a1 located on the side of the base portion 21 is formed by printing on the upper surface 21a of the base portion 21 simultaneously with the underlying conductive layer 24a1 which is to become the third upper surface conductor 24C and the fourth upper surface conductor 24D in manufacturing the resistance element 20B1. Meanwhile, the underlying conductive layer 24a2 that covers the underlying conductive layer 24a1 is formed by printing a predetermined paste again after printing of the underlying conductive layer 24a1, and is not formed on the third upper surface conductor 24C and the fourth upper surface conductor 24D.

With such a structure, the third upper surface conductor 24C and the fourth upper surface conductor 24D are thinner than the first upper surface conductor 24A and the second upper surface conductor 24B by the thickness of the bilayered covering conductive layers 24b and 24c and the thickness of the underlying conductive layer 24a2 which the third upper surface conductor 24C and the fourth upper surface conductor 24D do not have. Therefore, it becomes possible to ensure a large distance between the functional portion including the resistor 22, the protective film 23 and the third upper surface conductor 24C and the fourth upper surface conductor 24D, and the capacitor body 11 of the capacitor element 10, and it is possible to significantly reduce or prevent the occurrence of the defective connection more effectively.

Preferred Embodiment 3

Figure 12:
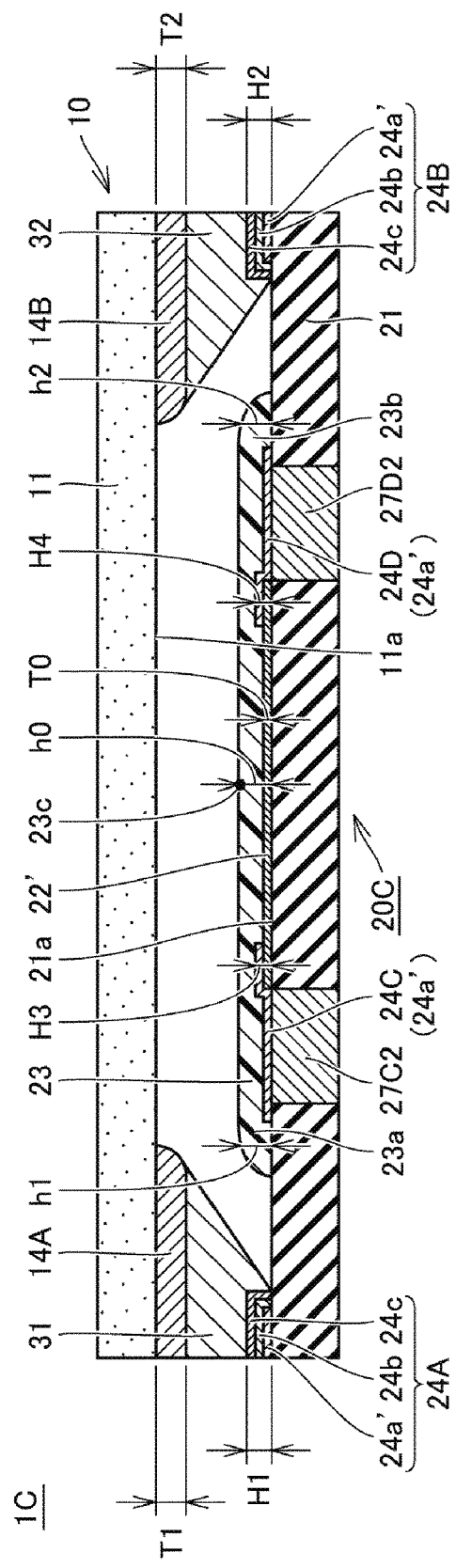
FIG. 12 is an enlarged schematic section view of a portion of a composite electronic component according to Preferred Embodiment 3 of the present invention.

FIG. 12 is an enlarged schematic section view of a portion of a composite electronic component 1C according to Preferred Embodiment 3 of the present invention. Hereinafter, referring to FIG. 12, the composite electronic component 1C according to the present preferred embodiment will be described.

As illustrated in FIG. 12, the composite electronic component 1C according to the present preferred embodiment includes a resistance element 20C including a structure different from that of the composite electronic component 1B according to Preferred Embodiment 2. The resistance element 20C is different from the resistance element 20B in the structure of the resistor, and in the structure of the first upper surface conductor 24A to the fourth upper surface conductor 24D.

Specifically, a resistor 22' shown in FIG. 12 includes a thin film formed to cover the upper surface 21a of the base portion 21, and is more specifically, includes a sputtered film of, for example, about 10 nm to about 30 nm inclusive. The thin film is a film formed by a thin film forming process, and the thickness thereof is less than about 1 μm. Among the thin films, the film formed by a sputtering method is called a sputtered film, and the film formed by a metal vapor deposition method is called a vapor deposition film.

Also, each of the first upper surface conductor 24A and the second upper surface conductor 24B includes a plurality of conductive layers including an underlying conductive layers 24a' and bilayered covering conductive layers 24b and 24c. The underlying conductive layer 24a' is a thin film, and specifically, a sputtered film including Cu or Ag of, for example, about 10 nm to about 30 nm inclusive. Each of the bilayered covering conductive layers is a plating layer.

On the other hand, each of the third upper surface conductor 24C and the fourth upper surface conductor 24D is defined exclusively by a thin film that is formed of a sputtered film simultaneously with the underlying conductive layer 24a' which is to become part of the first upper surface conductor 24A and the second upper surface conductor 24B, and is specifically, a sputtered film including Cu or Ag of, for example, about 10 nm to about 30 nm inclusive, and lacking the bilayered covering conductive layers which are plating layers.

Here, the thin film constituting the underlying conductive layer 24a' may also be a vapor deposition film in place of the sputtered film.

As illustrated in FIG. 12, regarding the resistor 22', one end thereof in the length direction L is covered with the third upper surface conductor 24C, and the other end is covered with the fourth upper surface conductor 24D. As a result, the third upper surface conductor 24C and the fourth upper surface conductor 24D are connected with the resistor 22'. Whether the third upper surface conductor 24C and the fourth upper surface conductor 24D cover the resistor 22' or the resistor 22' covers the third upper surface conductor 24C and the fourth upper surface conductor 24D depends on whether the resistor 22' is formed before or after formation of the third upper surface conductor 24C and the fourth upper surface conductor 24D, and either structure may be used.

Here, also in the composite electronic component 1C according to the present preferred embodiment, likewise the case of Preferred Embodiment 1, the dimension in the height direction H (height) h1 from the upper surface 21a of the base portion 21 of the resistance element 20C to an exposed surface of an end portion 23a which is one of the pair of end portions in the length direction L of the protective film 23 is smaller than the dimension in the height direction H (height) h0 from the upper surface 21a of the base portion 21 of the resistance element 20C to an exposed surface in a center portion 23c of the protective film 23. Also, the dimension in the height direction H (height) h2 from the upper surface 21a of the base portion 21 of the resistance element 20C to an exposed surface of an end portion 23b which is the other of the pair of end portions in the length direction L of the protective film 23 is smaller than the dimension in the height direction H (height) h0 from the upper surface 21a of the base portion 21 of the resistance element 20C to an exposed surface in the center portion 23c of the protective film 23. That is, h1<h0 and h2<h0 are satisfied.

The dimension in the height direction H (thickness) T0 of the resistor 22' is smaller than the dimension in the height direction H (thickness) T1 of the portion located on the lower surface 11a of the capacitor body 11 of the first external electrode 14A, and is smaller than the dimension in the height direction H (thickness) T2 of the portion located on the lower surface 11a of the capacitor body 11 of the second external electrode 14B. That is, T0<T1 and T0<T2 are satisfied.

Also, the dimension in the height direction H (height) H1 from the upper surface 21a of the base portion 21 to the surface of the first upper surface conductor 24A is higher than the dimension (height) H3 from the upper surface 21a of the base portion 21 to the surface of the portion in the third upper surface conductor 24C overlapped with the protective film 23 in the height direction H, and is higher than the dimension (height) H4 from the upper surface 21a of the base portion 21 to the surface of the portion in the fourth upper surface conductor 24D overlapped with the protective film 23 in the height direction H. That is, H3<H1 and H4<H1 are satisfied. Also, the dimension in the height direction H (height) H2 from the upper surface 21a of the base portion 21 to the surface of the second upper surface conductor 24B is higher than the dimension (height) H3 from the upper surface 21a of the base portion 21 to the surface of the portion in the third upper surface conductor 24C overlapped with the protective film 23 in the height direction H, and is higher than the dimension (height) H4 from the upper surface 21a of the base portion 21 to the surface of the portion in the fourth upper surface conductor 24D overlapped with the protective film 23 in the height direction H. That is, H3<H2 and H4<H2 are satisfied.

Therefore, also in the composite electronic component 1C according to the present preferred embodiment, likewise the case of the composite electronic component 1A, it is possible to reduce the possibility that the functional portion of the resistance element 20C including the resistor 22', the protective film 23 and the third upper surface conductor 24C and the fourth upper surface conductor 24D from comes into contact with the capacitor element 10, and it is possible to significantly reduce or prevent the occurrence of the defective connection effectively.

Furthermore, by forming the resistor 22' of a thin film resistor, more specifically, a sputtered film, and forming the third upper surface conductor 24C and the fourth upper surface conductor 24D of a sputtered film which is a thin film as in the present preferred embodiment, it is possible to the greatly reduce the thickness of the functional portion. The thin films of the resistor 22' and the third upper surface conductor 24C and the fourth upper surface conductor 24D are thinner than the plating layers of the first upper surface conductor 24A and the second upper surface conductor 24B. Therefore, also in this point, it is possible to reduce the possibility that the functional portion of the resistance element 20C comes into contact with the capacitor element 10, and it is possible to significantly reduce or prevent the occurrence of the defective connection.

Fourth Modified Example

Figure 13:
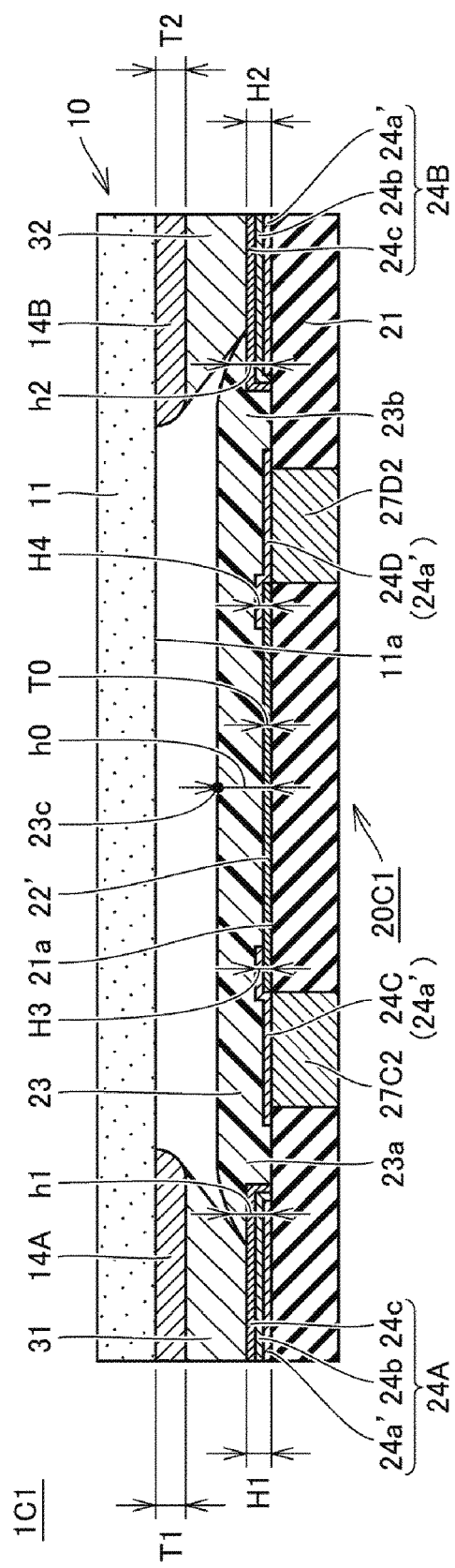
FIG. 13 is an enlarged schematic section view of a portion of a composite electronic component according to the fourth modified example of a preferred embodiment of the present invention.

FIG. 13 is an enlarged schematic section view of a portion of a composite electronic component 101 according to the fourth modified example. Hereinafter, referring to FIG. 13, the composite electronic component 101 according to the fourth modified example based on the present preferred embodiment will be described.

As illustrated in FIG. 13, the composite electronic component 101 according to the fourth modified example includes a resistance element 20C1 including a structure different from that of the composite electronic component 10. In the resistance element 20C1, the structure of the protective film 23 is different from that of the resistance element 20C.

Specifically, in the composite electronic component 101, the protective film 23 is provided in a broader range in the length direction L, and one end thereof in the length direction L covers a portion of the first upper surface conductor 24A, and the other end thereof covers a portion of the second upper surface conductor 24B. Therefore, it is possible to prevent the first upper surface conductor 24A and the second upper surface conductor 24B from being peeled off from the base portion 21 in mounting the capacitor element 10 on the resistance element 20C1.

Also with such a structure, it is possible to obtain the effect comparable to that in the case of the composite electronic component 1C.

Preferred Embodiment 4

Figure 14:
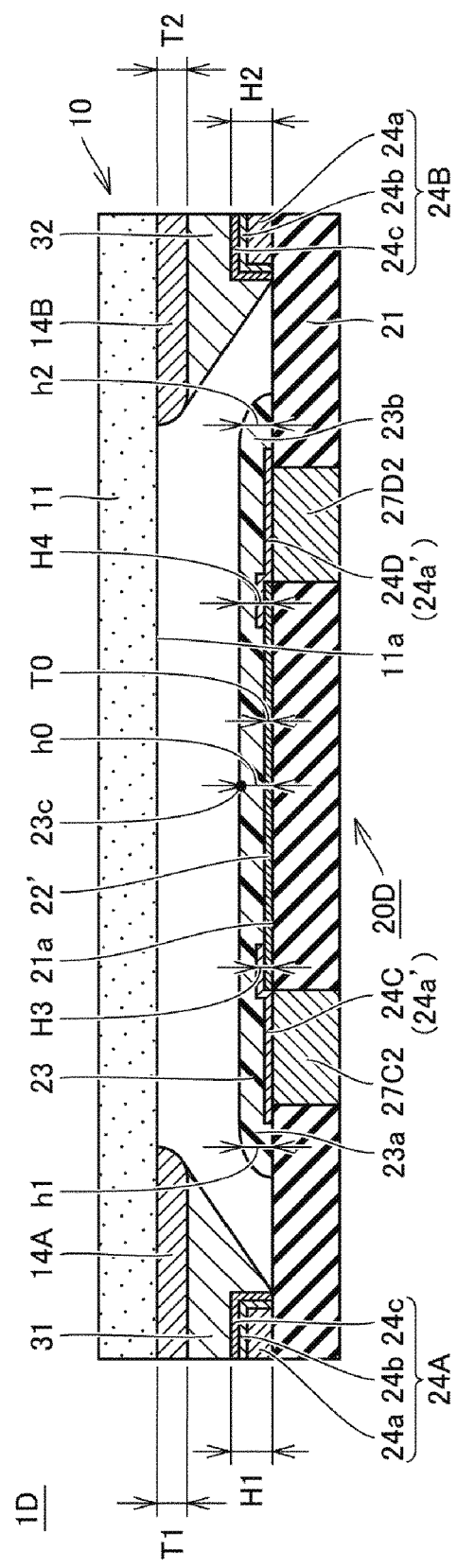
FIG. 14 is an enlarged schematic section view of a portion of a composite electronic component according to Preferred Embodiment 4 of the present invention.

FIG. 14 is an enlarged schematic section view of a portion of a composite electronic component 1D according to Preferred Embodiment 4 of the present invention. Hereinafter, referring to FIG. 14, the composite electronic component 1D according to the present preferred embodiment will be described.

As illustrated in FIG. 14, the composite electronic component 1D according to the present preferred embodiment includes a resistance element 20D including a structure different from that of the composite electronic component 1C according to Preferred Embodiment 3. The resistance element 20D is different from the resistance element 20C in the structure of the first upper surface conductor 24A and the second upper surface conductor 24B.

Specifically, likewise in the resistance element 20C, the resistor 22' includes a thin film, for example, a sputtered film, and the third upper surface conductor 24C and the fourth upper surface conductor 24D are defined exclusively by an underlying conductive layer 24a', and the underlying conductive layer 24a' is a thin film, for example, a sputtered film. Meanwhile, likewise in the resistance element 20A, the first upper surface conductor 24A and the second upper surface conductor 24B include a plurality of conductive layers including the underlying conductive layer 24a, and the underlying conductive layer 24a is a sintered metal layer formed by a thick film process.

Here, also in the composite electronic component 1D according to the present preferred embodiment, likewise the case of Preferred Embodiment 1, the dimension in the height direction H (height) h1 from the upper surface 21a of the base portion 21 of the resistance element 20D to an exposed surface of an end portion 23a which is one of the pair of end portions in the length direction L of the protective film 23 is smaller than the dimension in the height direction H (height) h0 from the upper surface 21a of the base portion 21 of the resistance element 20D to an exposed surface in a center portion 23c of the protective film 23. Also, the dimension in the height direction H (height) h2 from the upper surface 21a of the base portion 21 of the resistance element 20D to an exposed surface of an end portion 23b which is the other of the pair of end portions in the length direction L of the protective film 23 is smaller than the dimension in the height direction H (height) h0 from the upper surface 21a of the base portion 21 of the resistance element 20D to an exposed surface in the center portion 23c of the protective film 23. That is, h1<h0 and h2<h0 are satisfied.

The dimension in the height direction H (thickness) T0 of the resistor 22' is smaller than the dimension in the height direction H (thickness) T1 of the portion located on the lower surface 11a of the capacitor body 11 of the first external electrode 14A, and is smaller than the dimension in the height direction H (thickness) T2 of the portion located on the lower surface 11a of the capacitor body 11 of the second external electrode 14B. That is, T0<T1 and T0<T2 are satisfied.

Also, the dimension in the height direction H (height) H1 from the upper surface 21a of the base portion 21 to the surface of the first upper surface conductor 24A is higher than the dimension (height) H3 from the upper surface 21a of the base portion 21 to the surface of the portion in the third upper surface conductor 24C overlapped with the protective film 23 in the height direction H, and is higher than the dimension (height) H4 from the upper surface 21a of the base portion 21 to the surface of the portion in the fourth upper surface conductor 24D overlapped with the protective film 23 in the height direction H. That is, H3<H1 and H4<H1 are satisfied. Also, the dimension in the height direction H (height) H2 from the upper surface 21a of the base portion 21 to the surface of the second upper surface conductor 24B is higher than the dimension (height) H3 from the upper surface 21a of the base portion 21 to the surface of the portion in the third upper surface conductor 24C overlapped with the protective film 23 in the height direction H, and is higher than the dimension (height) H4 from the upper surface 21a of the base portion 21 to the surface of the portion in the fourth upper surface conductor 24D overlapped with the protective film 23 in the height direction H. That is, H3<H2 and H4<H2 are satisfied.

Therefore, also in the composite electronic component 1D according to the present preferred embodiment, likewise the case of the composite electronic component 1A, it is possible to reduce the possibility that the functional portion of the resistance element 20D including the resistor 22', the protective film 23 and the third upper surface conductor 24C and the fourth upper surface conductor 24D comes into contact with the capacitor element 10, and it is possible to significantly reduce or prevent the occurrence of the defective connection effectively.

Furthermore, by configuring the resistor 22' by a thin film, more specifically a sputtered film, and configuring the third upper surface conductor 24C and the fourth upper surface conductor 24D by a thin film, more specifically a sputtered film as in the present preferred embodiment, it is possible to dramatically reduce the thickness of the functional portion. In addition, by providing the first upper surface conductor 24A and the second upper surface conductor 24B with a thick film, more specifically a sintered metal layer, the difference in thickness between the first upper surface conductor 24A and the second upper surface conductor 24B, and the third upper surface conductor 24C and the fourth upper surface conductor 24D is large, so that it becomes possible to ensure a large distance between the functional portion and the capacitor body 11 of the capacitor element 10. Also in these points, it is possible to reduce the possibility that the functional portion of the resistance element 20D comes into contact with the capacitor element 10, and it is possible to significantly reduce or prevent the occurrence of the defective connection.

Fifth Modified Example

Figure 15:
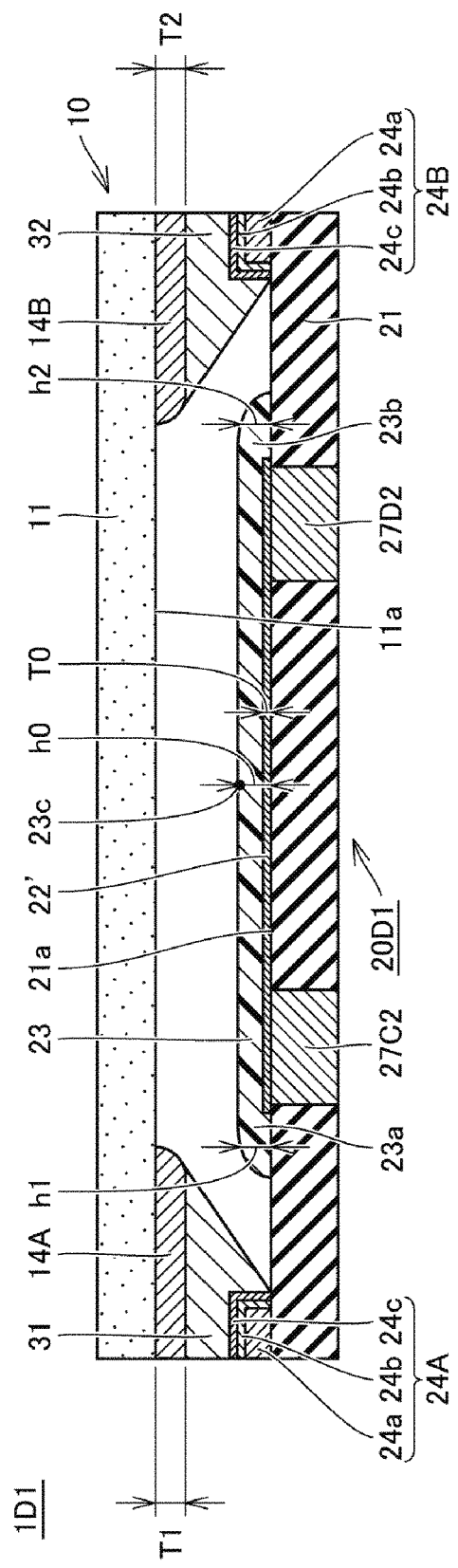
FIG. 15 is an enlarged schematic section view of a portion of a composite electronic component according to the fifth modified example.

FIG. 15 is an enlarged schematic section view of a portion of a composite electronic component 1D1 according to the fifth modified example. Hereinafter, referring to FIG. 15, the composite electronic component 1D1 according to the fifth modified example based on the present preferred embodiment will be described.

As illustrated in FIG. 15, the composite electronic component 1D1 according to the fifth modified example includes a resistance element 20D1 including a structure different from that of the composite electronic component 1D. In the resistance element 20D1, the connecting structure between the third connecting conductor and the fourth connecting conductor, and the resistor 22' is different from that of the resistance element 20D.

Specifically, in the composite electronic component 1D1, the resistance element 20D1 lacks the third upper surface conductor 24C and fourth upper surface conductor 24D, and each of the upper via conductor 27C2 and the upper via conductor 27D2 of the third connecting conductor and the fourth connecting conductor exposed from the upper surface 21a of the base portion 21 is covered with the resistor 22'. As a result, each of the upper via conductor 27C2 and the upper via conductor 27D2 of the third connecting conductor and the fourth connecting conductor is connected with the resistor 22'.

With such a structure, the functional portion including the resistor 22' and the protective film 23 is further thinned, and it is possible to reduce the possibility that the functional portion of the resistance element 20D1 comes into contact with the capacitor element 10, and it is possible to obtain the effect of simplifying the structure, the effect of reducing the production cost and so on.

In Preferred Embodiment 1 to Preferred Embodiment 4 of the present invention, and the first modified example to the fifth modified example based on these, while the description was made by illustrating the case where a multilayer ceramic capacitor is used as the capacitor element to be incorporated into the composite electronic component, it is also possible to incorporate other kind of capacitor element into the composite electronic component in place of the multilayer ceramic capacitor.

In Preferred Embodiment 1 to Preferred Embodiment 4 of the present invention, and the first modified example to the fifth modified example based on these, description was made by illustrating a capacitor element as an electronic element to be mounted on the a resistance element, however, the electronic element to be mounted on the resistance may be other electronic element than the capacitor element.

Further, naturally, characteristic structures shown in Preferred Embodiment 1 to Preferred Embodiment 4 of the present invention, and the first modified example to the fifth modified example based on these can be mutually combined without departing from the scope of the present invention.

Thus, the preferred embodiments and modified examples thereof described herein are merely illustrative in every point, and are not restrictive. The present invention should not be limited and interpreted by the preferred embodiments and the modified examples thereof, but embraces a scope of equivalents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite electronic component comprising:
   a resistance element; and
   an electronic element mounted on the resistance element in a height direction; wherein
   the resistance element includes:
   an insulating base portion including an upper surface and a lower surface intersecting with the height direction;
   a first upper surface conductor and a second upper surface conductor that are disposed on the upper surface of the base portion and are separated from each other in a length direction perpendicular or substantially perpendicular to the height direction;
   a resistor that is disposed on the upper surface of the base portion and is located between the first upper surface conductor and the second upper surface conductor;
   a third upper surface conductor that is disposed on the upper surface of the base portion, is located between the first upper surface conductor and the second upper surface conductor and is connected with the resistor; and
   a protective film that covers the resistor, a portion of the base portion, and at least a portion of the third upper surface conductor;
   the electronic element includes:
   an electronic element body including a lower surface intersecting with the height direction; and
   a first external electrode and a second external electrode that are disposed at least on the lower surface of the electronic element body and are separated from each other in the length direction; wherein
   the upper surface of the base portion and the lower surface of the electronic element body face each other in the height direction;
   the first upper surface conductor and the first external electrode are electrically connected;
   the second upper surface conductor and the second external electrode are electrically connected;
   at least one of the first and second upper surface conductors of the resistance element is not electrically connected to the resistor; and
   both a dimension in the height direction from the upper surface of the base portion to a surface of the first upper surface conductor, and a dimension in the height direction from the upper surface of the base portion to a surface of the second upper surface conductor are larger than a dimension in the height direction from the upper surface of the base portion to a surface of a portion of the third upper surface conductor overlapped with the protective film in the height direction of the third upper surface conductor.

2. The composite electronic component according to claim 1, wherein
   each of the first upper surface conductor and the second upper surface conductor includes a plating layer; and
   the portion overlapped with the protective film in the height direction of the third upper surface conductor is a sintered metal layer or a thin film directly covered with the protective film.

3. The composite electronic component according to claim 1, wherein each of the first upper surface conductor, the second upper surface conductor and the third upper surface conductor includes a sintered metal layer; and a dimension in the height direction of the sintered metal layer included in each of the first upper surface conductor and the second upper surface conductor is larger than a dimension in the height direction of a portion overlapped with the protective film in the height direction of the sintered metal layer included in the third upper surface conductor.

4. The composite electronic component according to claim 1, wherein each of the first upper surface conductor and the second upper surface conductor includes a sintered metal layer; and the portion overlapped with the protective film in the height direction of the third upper surface conductor is a sputtered film.

5. The composite electronic component according to claim 1, wherein the resistance element further includes:

a first lower surface conductor and a second lower surface conductor that are disposed on the lower surface of the base portion and are separated from each other in the length direction;

a third lower surface conductor that is disposed on the lower surface of the base portion and is located between the first lower surface conductor and the second lower surface conductor;

a first connecting conductor connecting the first upper surface conductor and the first lower surface conductor;

a second connecting conductor connecting the second upper surface conductor and the second lower surface conductor; and a third connecting conductor connecting the third upper surface conductor and the third lower surface conductor.

6. The composite electronic component according to claim 1, wherein the resistance element further includes:

a fourth upper surface conductor that is disposed on the upper surface of the base portion, and is located between the first upper surface conductor and the second upper surface conductor and is connected with the resistor; wherein the third upper surface conductor and the fourth upper surface conductor are separated from each other;

the protective film covers at least a portion of the fourth upper surface conductor; and both a dimension in the height direction from the upper surface of the base portion to a surface of the first upper surface conductor, and the dimension in the height direction from the upper surface of the base portion to the surface of the second upper surface conductor are larger than the dimension in the height direction from the upper surface of the base portion to the surface of a portion overlapped with the protective film in the height direction of the fourth upper surface conductor.

7. The composite electronic component according to claim 6, wherein each of the first upper surface conductor and the second upper surface conductor includes a plating layer; and each of the portion overlapped with the protective film in the height direction of the third upper surface conductor, and the portion overlapped with the protective film in the height direction of the fourth upper surface conductor is a sintered metal layer or a thin film directly covered with the protective film.

8. The composite electronic component according to claim 6, wherein each of the first upper surface conductor, the second upper surface conductor, the third upper surface conductor and the fourth upper surface conductor includes a sintered metal layer; and a dimension in the height direction of the sintered metal layer included in each of the first upper surface conductor and the second upper surface conductor is larger than both a dimension in the height direction of a portion overlapped with the protective film in the height direction of the sintered metal layer included in the third upper surface conductor, and a dimension in the height direction of a portion overlapped with the protective film in the height direction of the sintered metal layer included in the fourth upper surface conductor.

9. The composite electronic component according to claim 6, wherein each of the first upper surface conductor and the second upper surface conductor includes a sintered metal layer; and each of the portion overlapped with the protective film in the height direction of the third upper surface conductor, and the portion overlapped with the protective film in the height direction of the fourth upper surface conductor is a sputtered film.

10. The composite electronic component according to claim 6, wherein the resistance element further includes:

a first lower surface conductor and a second lower surface conductor that are disposed on the lower surface of the base portion and are separated from each other in the length direction;

a third lower surface conductor and a fourth lower surface conductor that are disposed on the lower surface of the base portion, are separated from each other, and are located between the first lower surface conductor and the second lower surface conductor;

a first connecting conductor connecting the first upper surface conductor and the first lower surface conductor;

a second connecting conductor connecting the second upper surface conductor and the second lower surface conductor;

a third connecting conductor connecting the third upper surface conductor and the third lower surface conductor; and a fourth connecting conductor connecting the fourth upper surface conductor and the fourth lower surface conductor.

11. A resistance element comprising:

an insulating base portion including an upper surface and a lower surface intersecting with a height direction;

a first upper surface conductor and a second upper surface conductor that are disposed on the upper surface of the base portion and are separated from each other in a length direction perpendicular or substantially perpendicular to the height direction;

a resistor that is disposed on the upper surface of the base portion and is located between the first upper surface conductor and the second upper surface conductor;

a third upper surface conductor that is disposed on the upper surface of the base portion, is located between the first upper surface conductor and the second upper surface conductor, and is connected with the resistor; and a protective film that covers the resistor, a portion of the base portion, and at least a portion of the third upper surface conductor; wherein at least one of the first and second upper surface conductors of the resistance element is not electrically connected to the resistor; and both a dimension in the height direction from the upper surface of the base portion to a surface of the first upper surface conductor, and a dimension in the height direction from the upper surface of the base portion to a surface of the second upper surface conductor are larger than a dimension in the height direction from the upper surface of the base portion to a surface of a portion overlapped with the protective film in the height direction of the third upper surface conductor.

12. The resistance element according to claim 11, wherein each of the first upper surface conductor and the second upper surface conductor includes a plating layer; and the portion overlapped with the protective film in the height direction of the third upper surface conductor is a sintered metal layer or a thin film directly covered with the protective film.

13. The resistance element according to claim 11, wherein each of the first upper surface conductor, the second upper surface conductor and the third upper surface conductor includes a sintered metal layer; and a dimension in the height direction of the sintered metal layer included in each of the first upper surface conductor and the second upper surface conductor is larger than a dimension in the height direction of a portion overlapped with the protective film in the height direction of the sintered metal layer included in the third upper surface conductor.

14. The resistance element according to claim 11, wherein each of the first upper surface conductor and the second upper surface conductor includes a sintered metal layer; and the portion overlapped with the protective film in the height direction of the third upper surface conductor is a sputtered film.

15. The resistance element according to claim 11, further comprising:

a first lower surface conductor and a second lower surface conductor that are disposed on the lower surface of the base portion and are separated from each other in the length direction;

a third lower surface conductor that is disposed on the lower surface of the base portion and is located between the first lower surface conductor and the second lower surface conductor;

a first connecting conductor connecting the first upper surface conductor and the first lower surface conductor;

a second connecting conductor connecting the second upper surface conductor and the second lower surface conductor; and a third connecting conductor connecting the third upper surface conductor and the third lower surface conductor.

16. The resistance element according to claim 11, further comprising:

a fourth upper surface conductor that is disposed on the upper surface of the base portion, is located between the first upper surface conductor and the second upper surface conductor, and is connected with the resistor; wherein the third upper surface conductor and the fourth upper surface conductor are separated from each other;

the protective film covers at least a portion of the fourth upper surface conductor;

both a dimension in the height direction from the upper surface of the base portion to a surface of the first upper surface conductor, and the dimension in the height direction from the upper surface of the base portion to the surface of the second upper surface conductor are larger than the dimension in the height direction from the upper surface of the base portion to the surface of a portion overlapped with the protective film in the height direction of the fourth upper surface conductor.

17. The resistance element according to claim 16, wherein each of the first upper surface conductor and the second upper surface conductor includes a plating layer; and each of the portion overlapped with the protective film in the height direction of the third upper surface conductor, and the portion overlapped with the protective film in the height direction of the fourth upper surface conductor is a sintered metal layer or a thin film directly covered with the protective film.

18. The resistance element according to claim 16, wherein each of the first upper surface conductor, the second upper surface conductor, the third upper surface conductor and the fourth upper surface conductor includes a sintered metal layer; and a dimension in the height direction of the sintered metal layer included in each of the first upper surface conductor and the second upper surface conductor is larger than both a dimension in the height direction of a portion overlapped with the protective film in the height direction of the sintered metal layer included in the third upper surface conductor, and a dimension in the height direction of a portion overlapped with the protective film in the height direction of the sintered metal layer included in the fourth upper surface conductor.

19. The resistance element according to claim 16, wherein each of the first upper surface conductor and the second upper surface conductor includes a sintered metal layer; and each of the portion overlapped with the protective film in the height direction of the third upper surface conductor, and the portion overlapped with the protective film in the height direction of the fourth upper surface conductor is a sputtered film.

20. The resistance element according to claim 16, further comprising:

a first lower surface conductor and a second lower surface conductor that are disposed on the lower surface of the base portion and are separated from each other in the length direction;

a third lower surface conductor and a fourth lower surface conductor that are disposed on the lower surface of the base portion, are separated from each other, and are located between the first lower surface conductor and the second lower surface conductor;

a first connecting conductor connecting the first upper surface conductor and the first lower surface conductor;

a second connecting conductor connecting the second upper surface conductor and the second lower surface conductor;

a third connecting conductor connecting the third upper surface conductor and the third lower surface conductor; and a fourth connecting conductor connecting the fourth upper surface conductor and the fourth lower surface conductor.

\* \* \* \* \*